United States Patent
Simsek-Ege et al.

(10) Patent No.: US 12,402,297 B2
(45) Date of Patent: Aug. 26, 2025

(54) MICROELECTRONIC DEVICES, RELATED ELECTRONIC SYSTEMS, AND METHODS OF FORMING MICROELECTRONIC DEVICES

(71) Applicant: Micron Technology, Inc., Boise, ID (US)

(72) Inventors: Fatma Arzum Simsek-Ege, Boise, ID (US); Richard E. Fackenthal, Carmichael, CA (US)

(73) Assignee: Micron Technology, Inc., Boise, ID (US)

( * ) Notice: Subject to any disclaimer, the term of this patent is extended or adjusted under 35 U.S.C. 154(b) by 628 days.

(21) Appl. No.: 17/805,201

(22) Filed: Jun. 2, 2022

(65) Prior Publication Data

US 2023/0397398 A1     Dec. 7, 2023

(51) Int. Cl.
*H01L 23/52*     (2006.01)
*H10B 12/00*     (2023.01)

(52) U.S. Cl.
CPC ............. *H10B 12/30* (2023.02); *H10B 12/03* (2023.02); *H10B 12/05* (2023.02); *H10B 12/50* (2023.02)

(58) Field of Classification Search
CPC ........ H10B 12/30; H10B 12/03; H10B 12/05; H10B 12/50; H10B 12/488; H10D 1/714
See application file for complete search history.

(56) References Cited

U.S. PATENT DOCUMENTS

| | | |
|---|---|---|
| 5,901,099 A | 5/1999 | Gilliam et al. |
| 6,778,452 B2 | 8/2004 | Beigel et al. |
| 8,067,286 B2 | 11/2011 | Parekh et al. |
| 8,153,499 B2 | 4/2012 | Or-Bach et al. |
| 8,184,471 B2 | 5/2012 | Woo et al. |
| 8,546,188 B2 | 10/2013 | Liu et al. |
| 8,716,116 B2 | 5/2014 | Parekh et al. |
| 9,543,433 B2 | 1/2017 | Anathan et al. |
| 10,163,480 B1 | 12/2018 | Kawamura et al. |
| 10,366,740 B1 | 7/2019 | Kim et al. |
| 11,848,309 B2 | 12/2023 | Simsek-Ege |
| 2011/0169072 A1* | 7/2011 | Lim ............... H10B 43/27 257/E21.409 |
| 2014/0347945 A1 | 11/2014 | Venkata et al. |
| 2018/0323199 A1* | 11/2018 | Roberts ............... H10D 64/518 |
| 2019/0074277 A1 | 3/2019 | Ramaswamy |

(Continued)

OTHER PUBLICATIONS

Simsek-Ege et al., "Microelectronic Devices, Related Electronic Systems, and Methods of Forming Microelectronic Devices", filed May 26, 2022, U.S. Appl. No. 17/804,234, 77 pages.

(Continued)

*Primary Examiner* — Samuel Park
(74) *Attorney, Agent, or Firm* — TraskBritt

(57) ABSTRACT

A microelectronic device comprises vertical stacks of memory cells, each vertical stack of memory cells comprising a vertical stack of access devices, a vertical stack of capacitors horizontally neighboring the vertical stack of access devices, and a conductive pillar structure vertically extending through the vertical stack of access devices. The microelectronic device further comprises multiplexers and additional transistors vertically overlying the vertical stacks of memory cells, and global digit lines vertically overlying the multiplexer and the additional transistor. Related electronic systems and methods are also described.

30 Claims, 15 Drawing Sheets

(56) References Cited

U.S. PATENT DOCUMENTS

| | | | |
|---|---|---|---|
| 2019/0244656 A1* | 8/2019 | Li | G11C 11/4097 |
| 2019/0244933 A1 | 8/2019 | Or-Bach et al. | |
| 2020/0052070 A1* | 2/2020 | Derner | H10B 12/50 |
| 2020/0066730 A1 | 2/2020 | Guo et al. | |
| 2020/0105330 A1* | 4/2020 | Kimura | H10D 87/00 |
| 2021/0217460 A1 | 7/2021 | Montierth et al. | |
| 2022/0399308 A1 | 12/2022 | Simsek-Ege et al. | |
| 2023/0018127 A1 | 1/2023 | Gandhi et al. | |
| 2023/0207505 A1 | 6/2023 | Simsek-Ege et al. | |
| 2023/0262988 A1* | 8/2023 | Harari | H10D 64/033 |
| | | | 257/295 |

OTHER PUBLICATIONS

Simsek-Ege, "Microelectronic Devices, Related Electronic Systems, and Methods of Forming Microelectronic Devices", filed May 26, 2022, U.S. Appl. No. 17/804,247, 89 pages.

Simsek-Ege, "Microelectronic Devices, Related Electronic Systems, and Methods of Forming Microelectronic Devices", filed May 26, 2022, U.S. Appl. No. 17/804,258, 98 pages.

Simsek-Ege, "Microelectronic Devices, Related Electronic Systems, and Methods of Forming Microelectronic Devices", filed May 26, 2022, U.S. Appl. No. 17/804,270, 119 pages.

* cited by examiner

MICROELECTRONIC DEVICES, RELATED ELECTRONIC SYSTEMS, AND METHODS OF FORMING MICROELECTRONIC DEVICES

TECHNICAL FIELD

The disclosure, in various embodiments, relates generally to the field of microelectronic device design and fabrication. More specifically, the disclosure relates to methods of forming microelectronic devices from independently formed microelectronic device structures, and to related microelectronic devices and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, volatile memory devices, such as dynamic random access memory (DRAM) devices; and non-volatile memory devices such as NAND Flash memory devices. A typical memory cell of a DRAM device includes one access device, such as a transistor, and one memory storage structure, such as a capacitor. Modern applications for semiconductor devices can employ significant quantities of memory cells, arranged in memory arrays exhibiting rows and columns of the memory cells. The memory cells may be electrically accessed through digit lines (e.g., bit lines, data lines) and word lines (e.g., access lines) arranged along the rows and columns of the memory cells of the memory arrays. Memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells.

Control logic devices within a base control logic structure underlying a memory array of a memory device have been used to control operations (e.g., access operations, read operations, write operations) of the memory cells of the memory device. An assembly of the control logic devices may be provided in electrical communication with the memory cells of the memory array by way of routing and interconnect structures. However, processing conditions (e.g., temperatures, pressures, materials) for the formation of the memory array over the base control logic structure can limit the configurations and performance of the control logic devices within the base control logic structure. In addition, the quantities, dimensions, and arrangements of the (Efferent control devices employed within the base control logic structure can also undesirably impede reductions to the size e a horizontal footprint) of the memory device, and/or improvements in the performance (e.g., faster memory cell ON/OFF speed, lower threshold switching voltage requirements, faster data transfer rates, lower power consumption) of the memory device. Furthermore, as the density and complexity of the memory array have increased, so has the complexity of the control logic devices. In some instances, the control logic devices consume more real estate than the memory devices, reducing the memory density of the memory device.

DETAILED DESCRIPTION

Figure 1A:
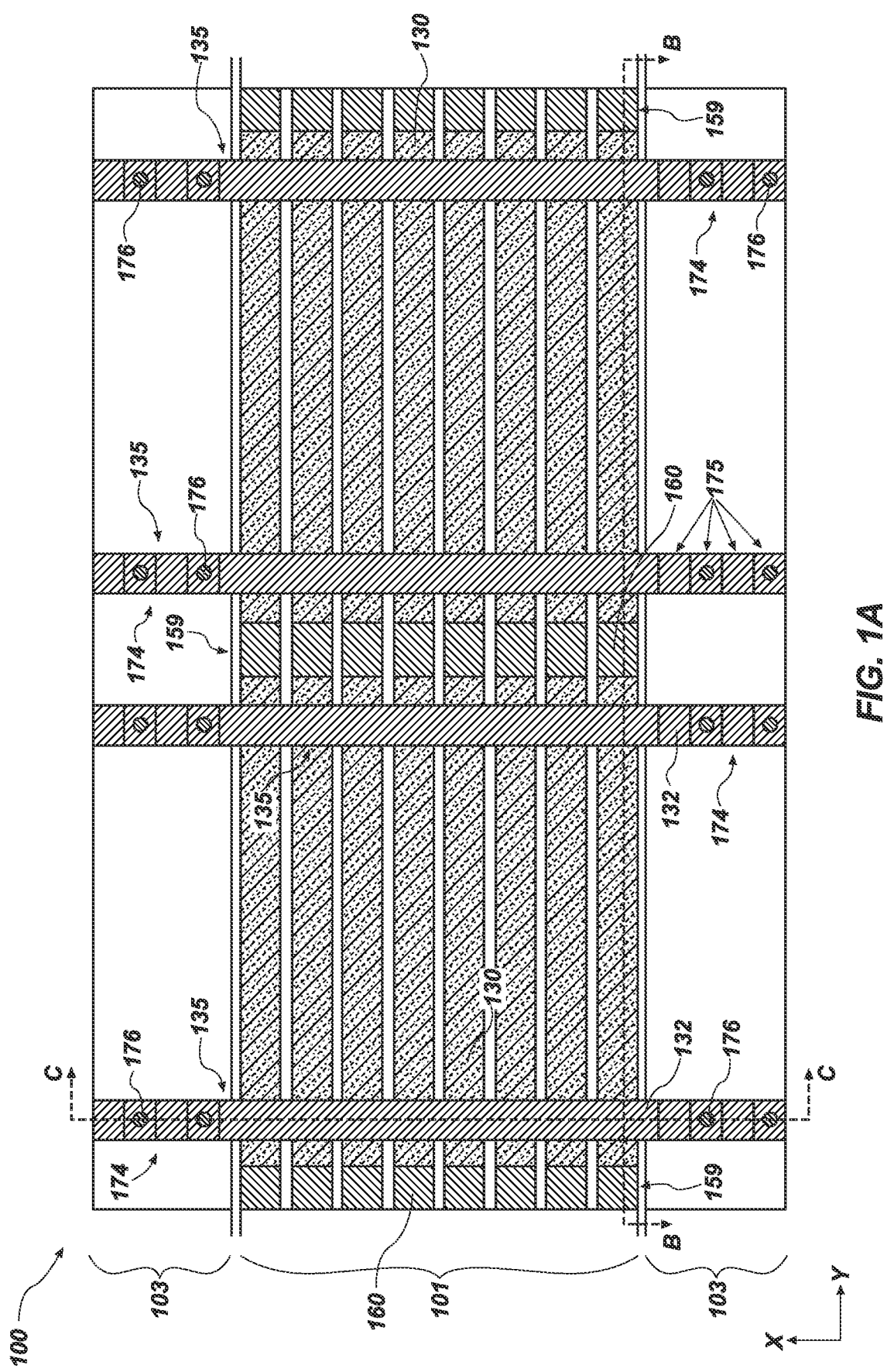
FIG. 1A through FIG. 1L are simplified partial top-down views (FIG. 1A and FIG. 1J) and simplified partial cross-sectional views (FIG. 1B through FIG. 1I, FIG. 1K, and FIG. 1L) illustrating a method of forming a first microelectronic device structure, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device), apparatus, or electronic system, or a complete microelectronic device, apparatus, or electronic system. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional DRAM; conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Jr), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively doped polysilicon, conductively doped germanium (Ge), conductively doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

As used herein, "semiconductor material" or "semiconductive material" refers to a material having an electrical conductivity between those of insulative materials and conductive materials. For example, a semiconductor material may have an electrical conductivity of between about $10^{-8}$ Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_xIn_{1-x}As_yP_{1-y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Further examples of semiconductor materials include oxide semiconductor materials such as zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials.

According to embodiments described herein, a first microelectronic device structure is formed by forming vertical stacks of memory cells. Each vertical stack of memory cells individually comprises a vertical stack of capacitor structures horizontally neighboring a vertical stack of access devices. A conductive pillar structure is in electrical communication with the vertical stack of access devices and may vertically extend through or proximate the vertical stack of access devices. A conductive plate structure vertically extends proximate to and in electrical communication with electrodes of each of the capacitor structures of the vertical stack of capacitor structures. In some embodiments, an additional vertical stack of memory cells horizontally neighbors the conductive plate structure and comprises additional vertical stacks of capacitor structures in electrical communication with the conductive plate structure and additional vertical stacks of access devices in electrical communication with the additional vertical stacks of capacitor structures. Multiplexers and additional transistors (e.g., "bleeder" transistors) vertically overlie the vertical stacks of memory cells. The multiplexers are configured to selectively electrically couple the conductive pillar structure of individual vertical stacks of memory cells to a global digit line vertically overlying the vertical stacks of memory cells. The additional transistors are configured to provide a bias to unselected memory cells by electrically connecting the conductive plate structure to the conductive pillar structure in electrical communication with unselected memory cells. In some embodiments, a source region of the multiplexers is shared with a source region of the additional transistors.

Forming the multiplexers and the additional transistors vertically over the vertical stacks of memory cells facilitates forming a larger density of memory cells in the microelectronic device structure. Conductive routing structures between the multiplexers and components of the vertical stacks of memory cells (e.g., between the multiplexers and a global digit line, between the multiplexers and the conductive pillar structures of the vertical stacks of memory cells, between the additional transistors and the conductive pillar structures of the vertical stacks of memory cells, and between the additional transistors and the conductive plate structure) facilitates electrically isolating horizontally neighboring conductive pillar structures of horizontally neighboring vertical stacks of memory cells while also providing a sufficient quantity of multiplexers and additional transistors vertically over the vertical stacks of memory cells facilitate control operations of the vertical stacks of memory cells. For example, electrically isolating horizontally neighboring conductive pillar structures of horizontally neighboring vertical stacks of memory cells facilitates an improved signal to noise ratio of sense amplifier devices that are formed in electrical communication with the global digit lines that are, in turn, in electrical communication with the multiplexers.

FIG. 1A through FIG. 1L are simplified partial top-down views (FIG. 1A and FIG. 1J) and simplified partial cross-sectional views (FIG. 1B through FIG. 1I, FIG. 1K, and FIG. 1L) illustrating a method of forming a first microelectronic device structure 100 (e.g., a memory device, such as a 3D DRAM memory device), in accordance with embodiments of the disclosure. With the description provided below, it will be readily apparent to one of ordinary skill in the art that the methods and structures described herein with reference to FIG. 1A through FIG. 1L may be used in various devices and electronic systems. The first microelectronic device structure 100 may also be referred to herein as a first die or a first wafer.

Figure 1B:
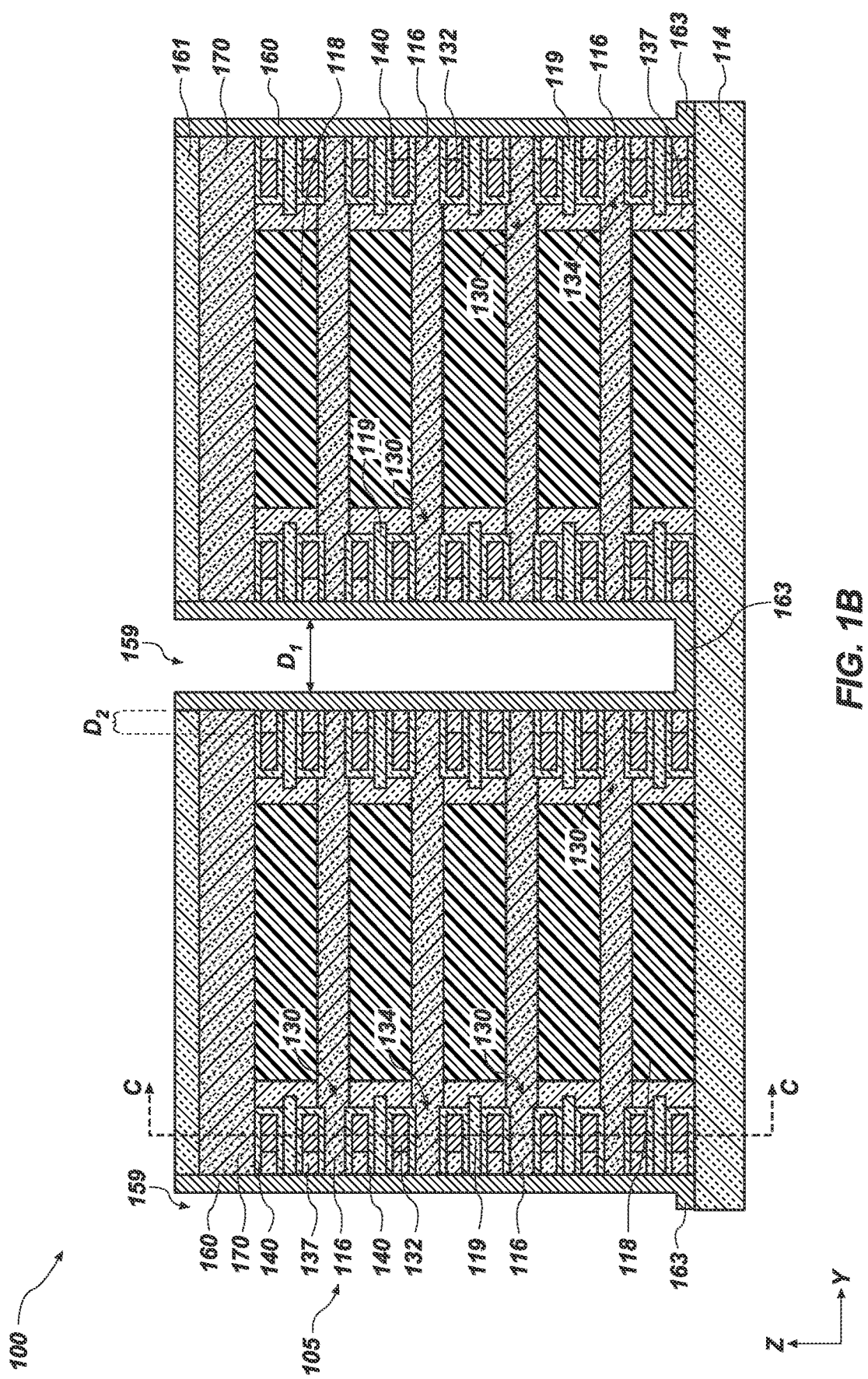
Figure 1C:
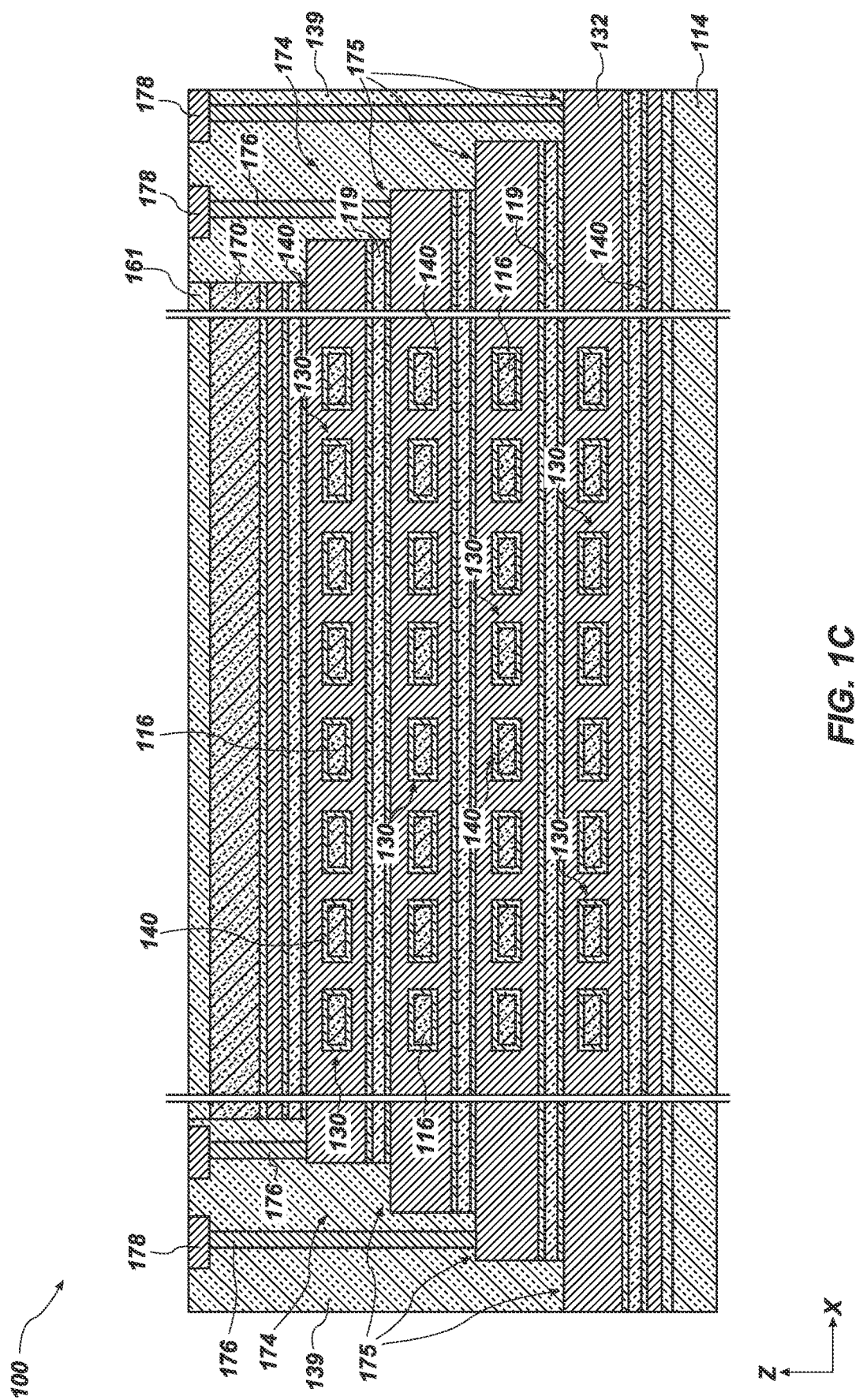

FIG. 1A is a simplified partial top-down view of the first microelectronic device structure 100; FIG. 1B is a simplified partial cross-sectional view of the first microelectronic device structure 100 taken through section line B-B of FIG. 1A; and FIG. 1C is a simplified partial cross-sectional view of the first microelectronic device structure 100 taken through section line C-C of FIG. 1A and section line C-C of FIG. 1B.

Referring to FIG. 1A, the first microelectronic device structure 100 includes an array region 101 (also referred herein as a "memory array region") and one or more peripheral regions 103 located external to the array region 101. In some embodiments, the peripheral regions 103 horizontally (e.g., in at least X-direction) surround the array region 101. In some embodiments, the peripheral regions 103 substantially surround all horizontal sides of the array region 101 in a first horizontal direction (e.g., the X-direction). In other embodiments, the peripheral regions 103 substantially surround all horizontal boundaries (e.g., an entire horizontal area) of the array region 101.

With reference to FIG. 1A and FIG. 1B, within the array region 101, the first microelectronic device structure 100 includes a vertical (e.g., in the Z-direction) stack structure 105 from which a vertical stack of memory cells (e.g., vertical stack of memory cells 120 (FIG. 1J through FIG. 1L)) will be formed over a first insulative material 114. The stack structure 105 includes a vertically alternating (e.g., in the Z-direction) sequence of a first material 116 and a second material 118.

The first insulative material 114 may be formed of and include insulative material. In some embodiments, the first insulative material 114 is formed of and includes insulative material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the first insulative material 114 comprises silicon dioxide. Each level of the first insulative material 114 may individually include a substantially homogeneous distribution of the at least one insulating material, or a substantially heterogeneous distribution of the at least one insulating material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each level of the first insulative material 114 exhibits a substantially homogeneous distribution of insulative material. In additional embodiments, at least one of the levels of the first insulative material 114 exhibits a substantially heterogeneous distribution of at least one insulative material. The levels of the first insulative material 114 may, for example, be formed of and include a stack (e.g., laminate) of at least two different insulative materials. Each of the levels of the first insulative material 114 may each be substantially planar, and may each individually exhibit a desired thickness.

The first material 116 may be formed of and include, for example, a semiconductive material (e.g., silicon) or an oxide material (e.g., silicon dioxide). In some embodiments, the first material 116 comprises silicon, such as epitaxially grown silicon. In some embodiments, the first material 116 comprises monocrystalline silicon.

The second material 118 may have a different material composition than the first material 116 and may exhibit an etch selectivity with respect to the first material 116. The second material 118 may be formed of and include one or more of silicon germanium, polysilicon, a nitride material (e.g., silicon nitride ($Si_3N_4$)), or an oxynitride material (e.g., silicon oxynitride). In some embodiments, such as where the first material 116 comprises silicon, the second material 118 comprises silicon germanium, such as epitaxially grown silicon germanium. In other embodiments, such as where the first material 116 comprises silicon, the second material 118 comprises polysilicon. In yet other embodiments, such as where the first material 116 comprises silicon dioxide, the second material 118 comprises silicon nitride or silicon oxynitride.

With continued reference to FIG. 1B, access devices 130 may be formed within the levels of the first material 116. The access devices 130 may comprise doped portions of the first material 116 to form channel regions 134. The channel regions 134 may be doped with one or more of at least one N-type dopant, such as one or more of arsenic ions, phosphorous ions, and antimony ions. In other embodiments, the channel regions 134 are doped with at least one P-type dopant, such as boron ions. In some embodiments, the channel regions 134 of the access devices 130 are horizontally between (e.g., in the X-direction, in the Y-direction) a source region and a drain region of the access devices 130. The access devices 130 vertically overlying (e.g., in the Z-direction) one another may be form a vertical stack of access devices 130.

In some embodiments, conductive structures 132 vertically overlie (e.g., in the Z-direction) and vertically underlie (e.g., in the Z-direction) each of the access devices 130, such as the channel regions 134 of each of the access devices 130. In some embodiments, the channel regions 134 are vertically surrounded by the conductive structures 132. The conductive structures 132 may individually be referred to herein as "first conductive lines," "access lines," or "word lines." In some embodiments, vertically neighboring (e.g., in the Z-direction) conductive structures 132 between vertically neighboring (e.g., in the Z-direction) access devices 130 are spaced from each other by the second insulative material 119.

The second insulative material 119 may be formed of and include an insulative material that is different than, and that has an etch selectivity with respect to, the first material 116. In some embodiments, the second insulative material 119 is formed of and includes one or more of the materials described above with reference to the first insulative material 114. In some embodiments, the second insulative material 119 is formed of and includes an oxide material (e.g., silicon dioxide).

The conductive structures 132 may extend horizontally (e.g., in the X-direction; FIG. 1A) through first microelectronic device structure 100 as lines (e.g., word lines) and may each be configured to be operably coupled to a vertically neighboring (e.g., in the Z-direction) access device 130 (e.g., the channel region 134 of a neighboring access device 130). In other words, a conductive structure 132 may be configured to be operably coupled to a vertically neighboring access device 130.

The conductive structures 132 vertically overlying (e.g., in the Z-direction) and within horizontal boundaries (e.g., in the X-direction, in the Y-direction) of one another may form a vertical stack structure 135 of conductive structures 132. As described in further detail below, each vertical stack structure 135 of conductive structures 132 may intersect more than one (e.g., two, three, four) vertical stacks of memory cells (e.g., vertical stacks of memory cells 120 (FIG. 1J through FIG. 1L)).

The conductive structures 132 may individually be formed of and include conductive material, such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium, etc.), polysilicon, or other materials exhibiting electrical conductivity. In some embodiments, the conductive structures 132 individually comprise tungsten. In other embodiments, the conductive structures individually comprise copper.

With combined reference to FIG. 1B and FIG. 1C, each of the access devices 130 is surrounded by the dielectric material 140, which may also be referred to herein as a "gate dielectric material." In some embodiments, the portion of the conductive structure 132 directly vertically neighboring (e.g., in the Z-direction) and located within horizontal boundaries (e.g., in the X-direction, in the Y-direction) of the dielectric material 140 may be referred to as a "gate electrode." In some embodiments, the conductive structures 132 are separated from the access devices 130 by the dielectric material 140.

In some embodiments, and as illustrated in FIG. 1C, each of the access devices 130 is substantially surrounded by the dielectric material 140 that is, in turn, substantially surrounded by the conductive structure 132. In some such embodiments, the access devices 130 may individually comprise so-called "gate all around" access devices (e.g., gate all around transistors) since each of the access devices 130 is individually substantially surrounded by one of the conductive structures 132.

The dielectric material 140 may be formed of and include insulative material. By way of non-limiting example, the dielectric material 140 may comprise one or more of phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride, another gate dielectric material), a dielectric carbon nitride material (e.g., silicon carbon nitride (SiCN)), or a dielectric carboxynitride material (e.g., silicon carboxynitride (SiOCN)).

With continued reference to FIG. 1C, in some embodiments, the dielectric material 140 may also be located on surfaces of the conductive structures 132 and between the conductive structures 132 and the second insulative material 119. Portions of the dielectric material 140 on surfaces of the second insulative material 119 may not be referred to as a "gate dielectric" material.

With collective reference to FIG. 1A and FIG. 1C, in some embodiments, the conductive structures 132 horizontally terminate (e.g., in the X-direction) at steps 175 of staircase structures 174 formed at horizontal ends (e.g., in the X-direction) of the conductive structures 132 and within a third insulative material 139. The steps 175 may each individually be at least partially defined by horizontal (e.g., in the X-direction) edges of the conductive structures 132.

Vertically higher (e.g., in the Z-direction) conductive structures 132 may have a smaller horizontal dimension (e.g., in the X-direction) than vertically lower conductive structures 132, such that horizontal edges of the conductive structures 132 at least partially define the steps 175 of the staircase structures 174.

With reference to FIG. 1A, in some embodiments, the staircase structures 174 are horizontally aligned in a first direction (e.g., in the X-direction) and horizontally offset in a second direction (e.g., the Y-direction). In some embodiments, each vertical stack structure 135 of conductive structures 132 individually includes a staircase structure 174 at a first horizontal end (e.g., in the X-direction) thereof and an additional staircase structure 174 at a second, opposite horizontal end (e.g., in the X-direction) thereof.

In other embodiments, the staircase structures 174 of horizontally neighboring (e.g., in the Y-direction) vertical stack structures 135 of conductive structures 132 may be located at opposing horizontal ends (e.g., in the X-direction) of the first microelectronic device structure 100. In some such embodiments, every vertical stack structure 135 of conductive structures 132 (e.g., in the Y-direction) includes a staircase structure 174 at a first horizontal end (e.g., in the X-direction) of the first microelectronic device structure 100 while the other vertical stack structures 135 of conductive structures 132 individually includes a staircase structure 174 at a second horizontal end (e.g., in the X-direction) of the first microelectronic device structure 100 opposite the first horizontal end. Stated another way, the staircase structures 174 of horizontally neighboring (e.g., in the Y-direction) conductive structures 132 may alternate between a first horizontal end (e.g., in the X-direction) of the first microelectronic device structure 100 and a second horizontal end (e.g., in the X-direction) of the first microelectronic device structure 100, the second horizontal end opposing the first horizontal end.

Although FIG. 1A illustrates two staircase structures 174 for every vertical stack structure 135 of conductive structures 132 (e.g., a staircase structure 174 at each horizontal end (e.g., in the X-direction) of each vertical stack structure 135 of conductive structures 132), the disclosure is not so limited. In other embodiments, each vertical stack structure 135 of conductive structures 132 may include one staircase structure 174, and each of the staircase structures 174 may be located at a same horizontal end (e.g., in the X-direction) of the vertical stack structure 135 of conductive structures 132.

The quantity of the steps 175 of the staircase structures 174 may correspond to the quantity of the levels of memory cells (e.g., memory cells 120 (FIG. 1J through FIG. 1L)) of vertical stacks of the memory cells to be formed in the first microelectronic device structure 100. Although FIG. 1A and FIG. 1C illustrate that the staircase structures 174 individually comprise a particular number (e.g., four (4)) steps 175, the disclosure is not so limited. In other embodiments, the staircase structures 174 each individually include a desired quantity of the steps 175, such as within a range from thirty-two (32) of the steps 175 to two hundred fifty-six (256) of the steps 175. In some embodiments, the staircase structures 174 each individually include sixty-four (64) of the steps 175. In other embodiments, the staircase structures 174 each individually include ninety-six (96) or more of the steps 175. In other embodiments, the staircase structures 174 each individually include a different number of the steps 175, such as less than sixty-four (64) of the steps 175 (e.g., less than or equal to sixty (60) of the steps 175, less than or equal to fifty (50) of the steps 175, less than or equal to forty (40) of the steps 175, less than or equal to thirty (30) of the steps 175, less than or equal to twenty (20) of the steps 175, less than or equal to ten (10) of the steps 175); or greater than sixty-four (64) of the steps 175 (e.g., greater than or equal to seventy (70) of the steps 175, greater than or equal to one hundred (100) of the steps 175, greater than or equal to about one hundred twenty-eight (128) of the steps 175, greater than two hundred fifty-six (256) of the steps 175).

In some embodiments, the staircase structures 174 each individually include the same quantity of the steps 175. In some such embodiments, staircase structures 174 of the same vertical stack structure 135 include the same quantity of the steps 175. In some embodiments, each step 175 of each staircase structure 174 may be vertically offset (e.g., in the Z-direction) from a vertically neighboring step 175 of the staircase structure 174 by one level (e.g., one tier) of the vertically alternating conductive structures 132 and the vertically intervening (e.g., in the Z-direction) dielectric material 140 and second insulative material 119. In some such embodiments, every conductive structure 132 of the vertical stack structure 135 may comprise a step 175 at each horizontal end (e.g., in the X-direction) of the staircase structures 174 of the vertical stack structure 135. In other embodiments, vertically neighboring (e.g., in the Z-direction) steps 175 of a staircase structure 174 on a first horizontal size (e.g., in the X-direction) of a vertical stack structure 135 may be vertically offset (e.g., in the Z-direction) by two levels (e.g., two tiers) of the vertically alternating conductive structures 132 and the vertically intervening dielectric material 140 and second insulative material 119. In some such embodiments, the steps 175 of each staircase structure 174 are formed of every other conductive structure 132 of the vertical stack structure 135 and the steps 175 of staircase structures 174 at horizontally opposing ends (e.g., in the X-direction) of the same vertical stack structure 135 may be defined by conductive structures 132 that are vertically spaced (e.g., in the Z-direction) from one another by one level of a conductive structure 132 and the vertically intervening dielectric material 140 and second insulative material 119.

With continued reference to FIG. 1A and FIG. 1C, conductive contact structures 176 may be formed in electrical communication with individual steps 175 of the staircase structures 174 and pad structures 178 may be formed in electrical communication with the conductive contact structures 176. The conductive contact structures 176 may be in electrical communication with individual conductive structures 132 at the steps 175. For example, the conductive contact structures 176 may individually physically contact (e.g., land on) portions of upper (e.g., in the Z-direction) surfaces of the conductive structures 132 at least partially defining treads of the steps 175. In some embodiments, every other step 175 of each staircase structure 174 may be in electrical communication with a conductive contact structure 176. In some such embodiments, each vertical stack structure 135 of conductive structures 132 includes one staircase structure 174 at each horizontal (e.g., in the X-direction) end thereof and every other step 175 of each staircase structure 174 is individually in contact with a conductive contact structure 176. Each conductive structure 132 of a first staircase structure 174 at a first horizontal end of the vertical stack structure 135 not in electrical communication with a conductive contact structure 176 may individually be in electrical communication with a conductive contact structure 176 at steps 175 of a second staircase structure 174 at a second, opposite horizontal end of the vertical stack structure 135. In other embodiments, each step 175 of each staircase structure 174 may be in electrical communication with a conductive contact structure 176 at the horizontal (e.g., in the X-direction) end of the staircase structure 174.

The conductive contact structures 176 and the pad structures 178 may individually be formed of and include conductive material, such as one or more of the materials described above with reference to the conductive structures 132. In some embodiments, the conductive contact structures 176 and the pad structures 178 comprise substantially the same material composition as the conductive structures 132. In other embodiments, the conductive contact structures 176 and the pad structures 178 comprise a different material composition than the conductive structures 132. In some embodiments, the conductive contact structures 176 and the pad structures 178 individually comprise tungsten.

The third insulative material 139 may be formed of and include insulative material, such as one or more of the materials described above with reference to the first insulative material 114. In some embodiments, the third insulative material 139 is formed of and includes silicon dioxide.

With reference back to FIG. 1B, vertically neighboring (e.g., in the Z-direction) access devices 130 are spaced from one another by a fourth insulative material 137. In some embodiments, the fourth insulative material 137 surrounds at least a portion of the dielectric material 140 and horizontally intervenes (e.g., in the Y-direction) between the dielectric material 140 and the second material 118.

The fourth insulative material 137 may be formed of and include insulative material having an etch selectivity with respect to the second material 118. In some embodiments, the fourth insulative material 137 comprises a nitride material (e.g., silicon nitride ($Si_3N_4$)) or an oxynitride material (e.g., silicon oxynitride). In some embodiments, the fourth insulative material 137 comprises silicon nitride.

Conductive pillar structures 160 may vertically extend (e.g., in the Z-direction) through openings 159 within the first microelectronic device structure 100. The conductive pillar structures 160 may also be referred to herein as "digit lines," "second conductive lines," "digit line pillar structures," "local digit lines," or "vertical digit lines." Each conductive pillar structure 160 vertically extends through the first microelectronic device structure 100, such as through or horizontally neighboring (e.g., in the Y-direction) the vertical stack of access devices 130. In some embodiments, the conductive pillar structures 160 horizontally neighbor (e.g., in the Y-direction) a source region or a drain region of the access devices 130. In other embodiments, such as where the access devices 130 consist essentially of the channel regions 134 (and do not include, for example, a source region and a drain region), the conductive pillar structures 160 directly contact the channel region 134 of the access devices 130. The conductive pillar structures 160 are individually in electrical communication with the access devices 130 of the vertical stack of access devices 130.

The conductive pillar structures 160 may individually be formed of and include conductive material, such as one or more of a metal (e.g., one or more of tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium, etc.), polysilicon, or other materials exhibiting electrical conductivity. In some embodiments, the conductive pillar structures 160 comprise tungsten.

As described in further detail herein, the conductive structures 132 may be configured to provide sufficient voltage to a channel region 134 of each of the access devices 130 to electrically couple a storage device (e.g., storage device 150 (FIG. 1J through FIG. 1L)) horizontally neighboring (e.g., in the Y-direction) and associated with the access device 130 to, for example, a conductive pillar structure 160 vertically extending (e.g., in the Z-direction) through the first microelectronic device structure 100 and in electrical communication with the vertical stack of access devices 130. Stated another way, each conductive structure 132 may individually comprise a gate structure configured to provide a sufficient voltage to the channel region 134 vertically neighboring (e.g., in the Z-direction) the conductive structure 132 to electrically couple the access device 130 to a horizontally neighboring (e.g., in the Y-direction) storage device.

In some embodiments, horizontally neighboring (e.g., in the X-direction, in the Y-direction) conductive pillar structures 160 within an opening 159 are in electrical communication with one another through conductive material 163 horizontally extending between and electrically connecting the neighboring conductive pillar structures 160. The conductive material 163 may be formed of and include conductive material, such as one or more of the materials described above with reference to the conductive pillar structures 160. In some embodiments the conductive material 163 comprises substantially the same material composition as the conductive pillar structures 160. As described in further detail herein, the horizontally extending conductive material 163 may be removed to electrically isolate the conductive pillar structures 160 from one another to form vertical stacks of memory cells, each of the conductive pillar structures 160 individually in electrical communication with a vertical stack of access devices 130 of a different vertical stack of memory cells (e.g., memory cells 120 (FIG. 1J through FIG. 1L)).

A dimension $D_1$ (e.g., a diameter) of the openings 159 between opposing surfaces of the conductive pillar structures 160 may be within a range of from about 60 nanometers (nm) to about 120 nm, such as from about 60 nm to about 80 nm, from about 80 nm to about 100 nm, or from about 100 nm to about 120 nm. In some embodiments, the dimension $D_1$ is from about 80 nm to about 100 nm.

In some embodiments, a distance $D_2$ between a surface of the conductive pillar structure 160 and the conductive structures 132 (corresponding to the horizontal length (e.g., in the Y-direction) of the access device 130 between the conductive pillar structure 160 and the conductive structure 132) may be within a range of from about 10 nm to about 50 nm, such as from about 10 nm to about 20 nm, from about 20 nm to about 30 nm, from about 30 nm to about 40 nm, or from about 40 nm to about 50 nm. In some embodiments, the distance $D_2$ is about 5 nm. However, the distance $D_2$ may be different than (e.g., less than, greater than) those described above. The distance $D_2$ may be referred to herein as a "junction" length between the conductive pillar structure 160 and the access device 130. In some embodiments, the distance $D_2$ corresponds to a horizontal length (e.g., in the Y-direction) of the channel region 134 between the conductive pillar structure 160 and the conductive structure 132.

With reference to FIG. 1B and FIG. 1C, a semiconductive material 170 vertically overlies (e.g., in the Z-direction) a vertically (e.g., in the Z-direction) uppermost level of the first insulative material 114. In some embodiments, the semiconductive material 170 comprises silicon. In some embodiments, the semiconductive material 170 comprises single-crystal silicon. As described in further detail herein, the semiconductive material 170 may be used to form one or more control logic devices of the first microelectronic device structure 100 to facilitate control operations for memory cells (e.g., memory cells 120 (FIG. 1J through FIG. 1L)) of the first microelectronic device structure 100.

A fifth insulative material 161 vertically overlies (e.g., in the Z-direction) the semiconductive material 170. The fifth insulative material 161 may be formed of and include one or more insulative materials, such as one or more of the materials described above with reference to the first insulative material 114. In some embodiments, the fifth insulative material 161 comprises silicon dioxide.

With reference to FIG. 1A, although the fifth insulative material 161 vertically overlies (e.g., in the Z-direction) portions of the first microelectronic device structure 100, the fifth insulative material 161 is not illustrated in FIG. 1A. Rather, for clarity and ease of understanding the description, only portions of the first microelectronic device structure 100 are illustrated in FIG. 1A to illustrate the relative position of different portions of the first microelectronic device structure 100.

Figure 1D:
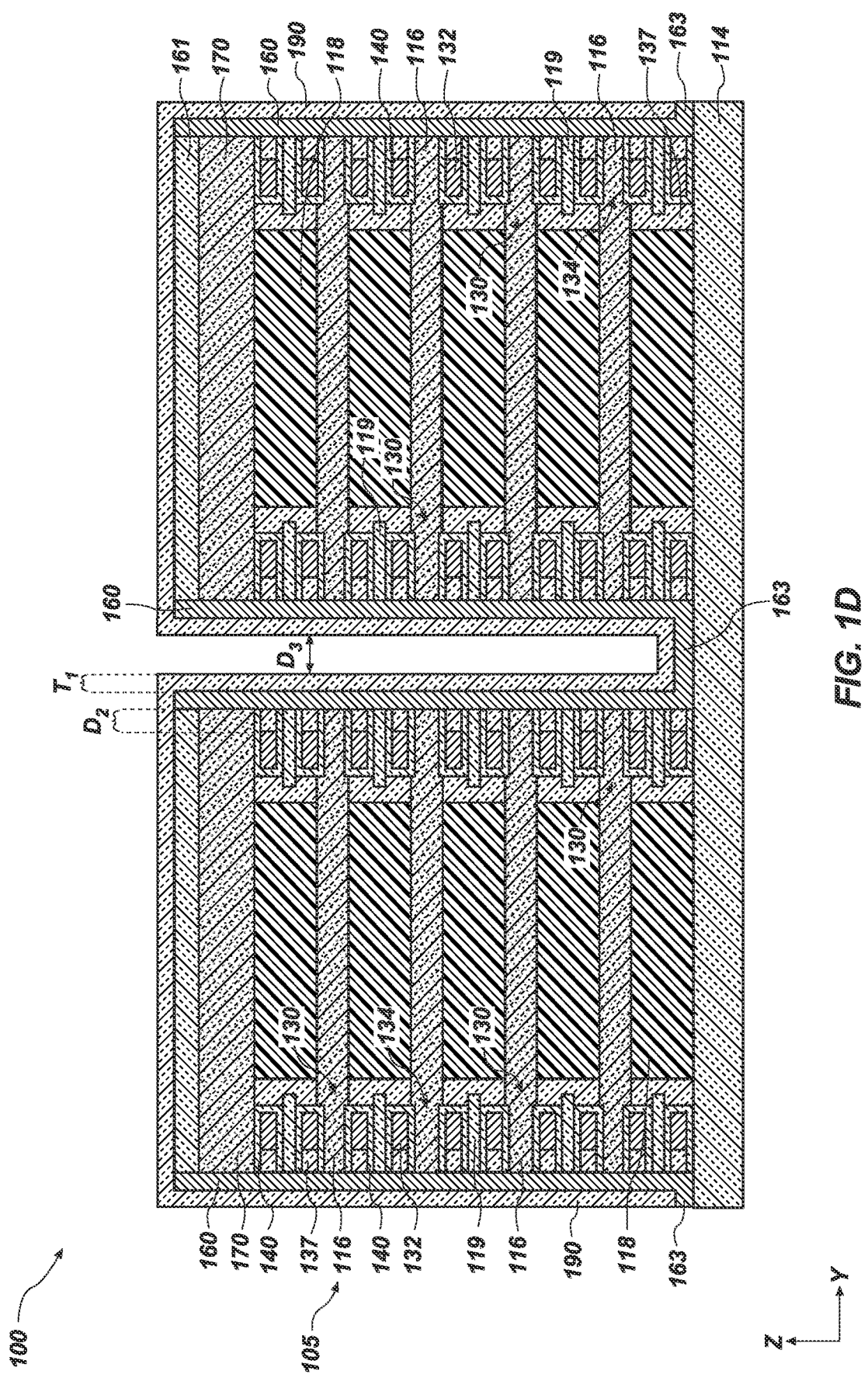

FIG. 1D is a simplified partial cross-sectional view of the first microelectronic device structure 100 at a later processing stage than that illustrated in FIG. 1A through FIG. 1C. The cross-sectional view of FIG. 1D illustrates the same cross-sectional view illustrated in FIG. 1B.

With reference to FIG. 1D, an insulative liner material 190 may be formed within the openings 159 and vertically over the first microelectronic device structure 100. The insulative liner material 190 may overlie and contact portions of the conductive pillar structures 160 within the openings 159.

In some embodiments, the insulative liner material 190 is formed to a thickness $T_1$ such that the insulative liner material 190 does not completely fill the openings 159. In some such embodiments, the thickness $T_1$ may be less than one-half the dimension $D_1$ of the openings 159. In some embodiments, the thickness $T_1$ is less than about one-third, such as less than about one-quarter of the dimension $D_1$ of the openings 159.

The thickness $T_1$ may be within a range of from about 10 nm to about 30 nm, such as from about 10 nm to about 20 nm, or from about 20 nm to about 30 nm. In some embodiments, the thickness $T_1$ is about 20 nm. In some embodiments, a distance $D_3$ between opposing portions of the insulative liner material 190 within the openings 159 may be within a range of from about 30 nm to about 60 nm, such as from about 30 nm to about 40 nm, from about 40 nm to about 50 nm, or from about 50 nm to about 60 nm. In some embodiments, the distance $D_3$ is at least about 30 nm. In other embodiments, the distance $D_3$ is at least about 40 nm.

In some embodiments, the thickness $T_1$ of the insulative liner material 190 is less than about thirty percent (30%) of the dimension $D_1$ (FIG. 1B) such that at least about forty percent of the dimension $D_1$ of the opening 159 (FIG. 1B) remains open to facilitate dry etching of vertically lower (e.g., in the Z-direction) portions of the openings 159 to remove material (e.g., portions of the insulative liner material 190, portions of the conductive pillar structures 160) from vertically lower portions of the openings 159.

The insulative liner material 190 may comprise a material configured and formulated such that sidewalls of the conductive pillar structures 160 are not substantially oxidized by formation of (e.g., deposition of, such as by ALD) the insulative liner material 190. In some embodiments, exposed surface of the conductive pillar structures 160 are exposed to hydrogen ($H_2$) gas prior to formation of the insulative liner material 190.

The insulative liner material 190 may be formed of and include insulative material. By way of non-limiting example, in some embodiments, the insulative liner material 190 is formed of and includes an oxide material (e.g., silicon dioxide, zirconium oxide, hafnium oxide, aluminum oxide), a nitride material (e.g., silicon nitride), or an oxynitride (e.g., silicon oxynitride (SiON)). In some embodiments, the insulative liner material 190 comprises an oxide material.

Figure 1E:
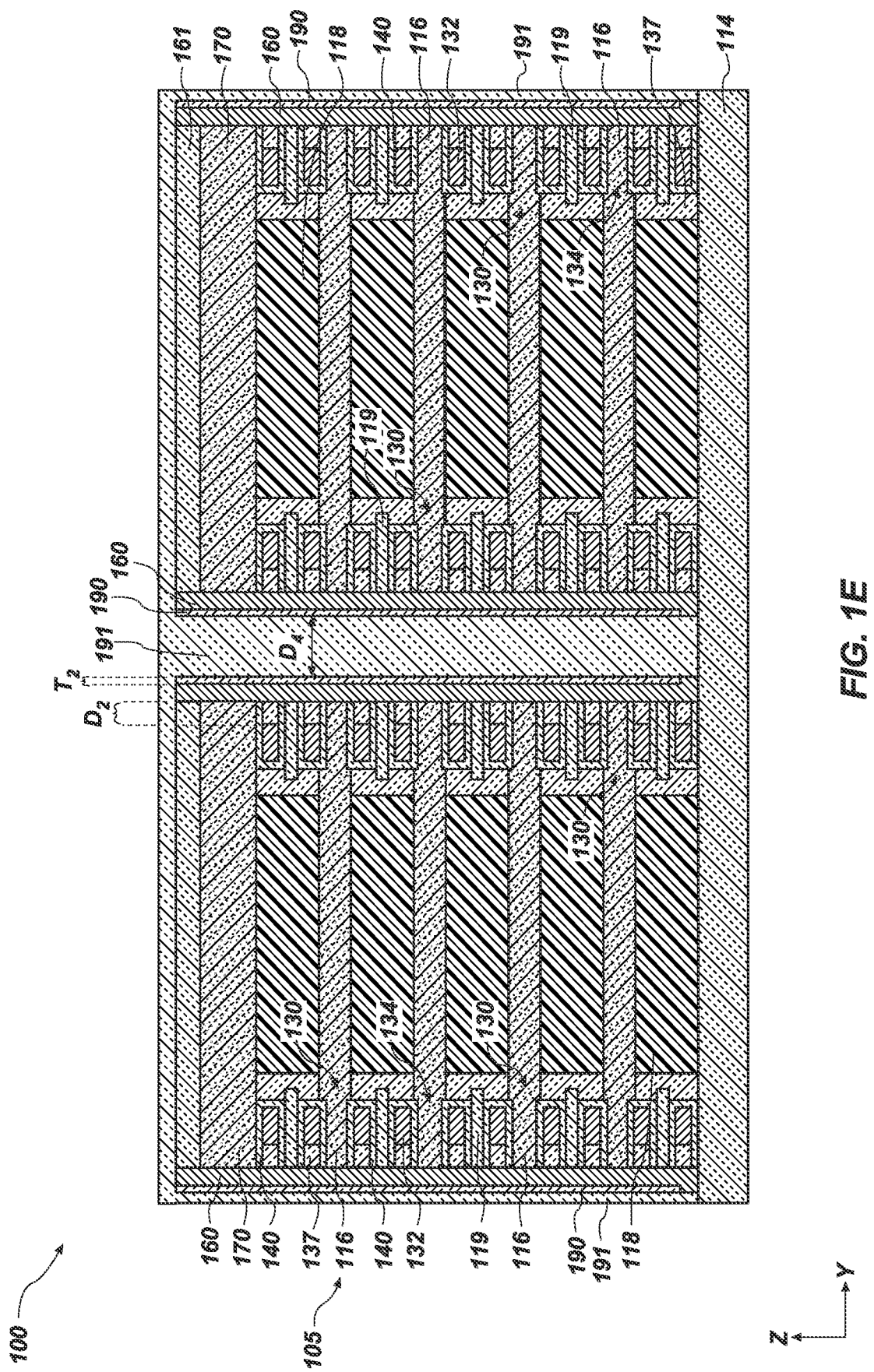

FIG. 1E is a simplified partial cross-sectional view of the first microelectronic device structure 100 at a later processing stage than that illustrated in FIG. 1D and illustrating the same cross-sectional view as that illustrated in FIG. 1D.

With reference to FIG. 1E, vertically lower (e.g., in the Z-direction) portions of the insulative liner material 190 may be removed through the openings 159 (FIG. 1D) to expose the conductive material 163 horizontally extending (e.g., in the X-direction, in the Y-direction) between horizontally neighboring conductive pillar structures 160. In some embodiments, horizontally extending (e.g., in the X-direction, in the Y-direction) portions of the insulative liner material 190 are removed, such as by exposing the insulative liner material 190 to one or more dry etchants through the openings 159. The one or more dry etchants may be formulated and configured to substantially remove the horizontally extending portions of the insulative liner material 190 without substantially removing the conductive pillar structures 160. Stated another way, the one or more dry etchants may be selective to the insulative liner material 190 to selectively remove portions of the insulative liner material 190 relative to the conductive pillar structures 160.

In some embodiments, exposing the insulative liner material 190 to one or more dry etchants and removing the horizontally extending portions of the insulative liner material 190 from vertically lower (e.g., in the Z-direction) portions of the openings 159 (FIG. 1D) includes horizontally thinning (e.g., in the X-direction, in the Y-direction) vertically extending (e.g., in the Z-direction) portions of the insulative liner material 190 through the openings 159. In some embodiments, a thickness $T_2$ of the insulative liner material 190 after removal of the horizontally extending portions of the insulative liner material 190 may be less than the thickness $T_1$ (FIG. 1D) of the insulative liner material 190 prior to removal of the horizontally extending portions of the insulative liner material 190. The thickness $T_2$ may be within a range of from about 3 nm to about 15 nm, such as from about 3 nm to about 5 nm, from about 5 nm to about 10 nm, or from about 10 nm to about 15 nm. In some embodiments, the thickness $T_2$ is about 5 nm.

A distance $D_4$ between opposing portions of the insulative liner material 190 may be within a range of from about 40 nm to about 70 nm, such as from about 40 nm to about 50 nm, from about 50 nm to about 60 nm, or from about 60 nm to about 70 nm. However, the disclosure is not so limited and the distance $D_4$ may be different than those described above.

With continued reference to FIG. 1E, after removing the horizontally extending (e.g., in the X-direction, in the Y-direction) portions of the insulative liner material 190, the horizontally extending conductive material 163 electrically connecting horizontally neighboring conductive pillar structures 160 within the openings 159 may be removed. In some embodiments, the conductive material 163 is exposed to an etchant formulated and configured to selectively remove the exposed portions of the conductive material 163 and expose the vertically underlying (e.g., in the Z-direction) first insulative material 114.

The conductive material 163 at the vertically lower (e.g., in the Z-direction) portion of the openings 159 (FIG. 1D) may be removed by exposing the conductive material 163 to one or more wet etchants. By way of non-limiting example, the conductive material 163 may be exposed to one or more of ammonium hydroxide ($NH_4OH$), hydrogen peroxide ($H_2O_2$), deionized (DI) water, hydrofluoric acid (HF), and nitric acid ($HNO_3$).

Removing the conductive material 163 may form isolated conductive pillar structures 160. For example, each opening 159 (FIG. 1D) may include two isolated conductive pillar structures 160, each of which is individually in electrical communication with the horizontally neighboring vertical stack of access devices 130. As described in further detail herein, each isolated conductive pillar structure 160 forms a portion of a vertical stack of memory cells (e.g., memory cells 120 (FIG. 1J through FIG. 1L)) and is configured to be in electrical communication with storage devices (e.g., storage devices 150 (FIG. 1J through FIG. 1L)) of the vertical stack of memory cells by means of the access devices 130.

A sixth insulative material 191 may be formed within the openings 159 (FIG. 1D) and vertically over (e.g., in the Z-direction) exposed portions of the insulative liner material 190 defining sidewalls of the openings 159 and on the exposed portions of the first insulative material 114 at the vertically lowermost (e.g., in the Z-direction) portion of the openings 159.

The sixth insulative material 191 may be formed of and include insulative material, such as one or more of the materials described above with reference to the first insulative material 114. In some embodiments, the sixth insulative material 191 comprises silicon dioxide.

Figure 1F:
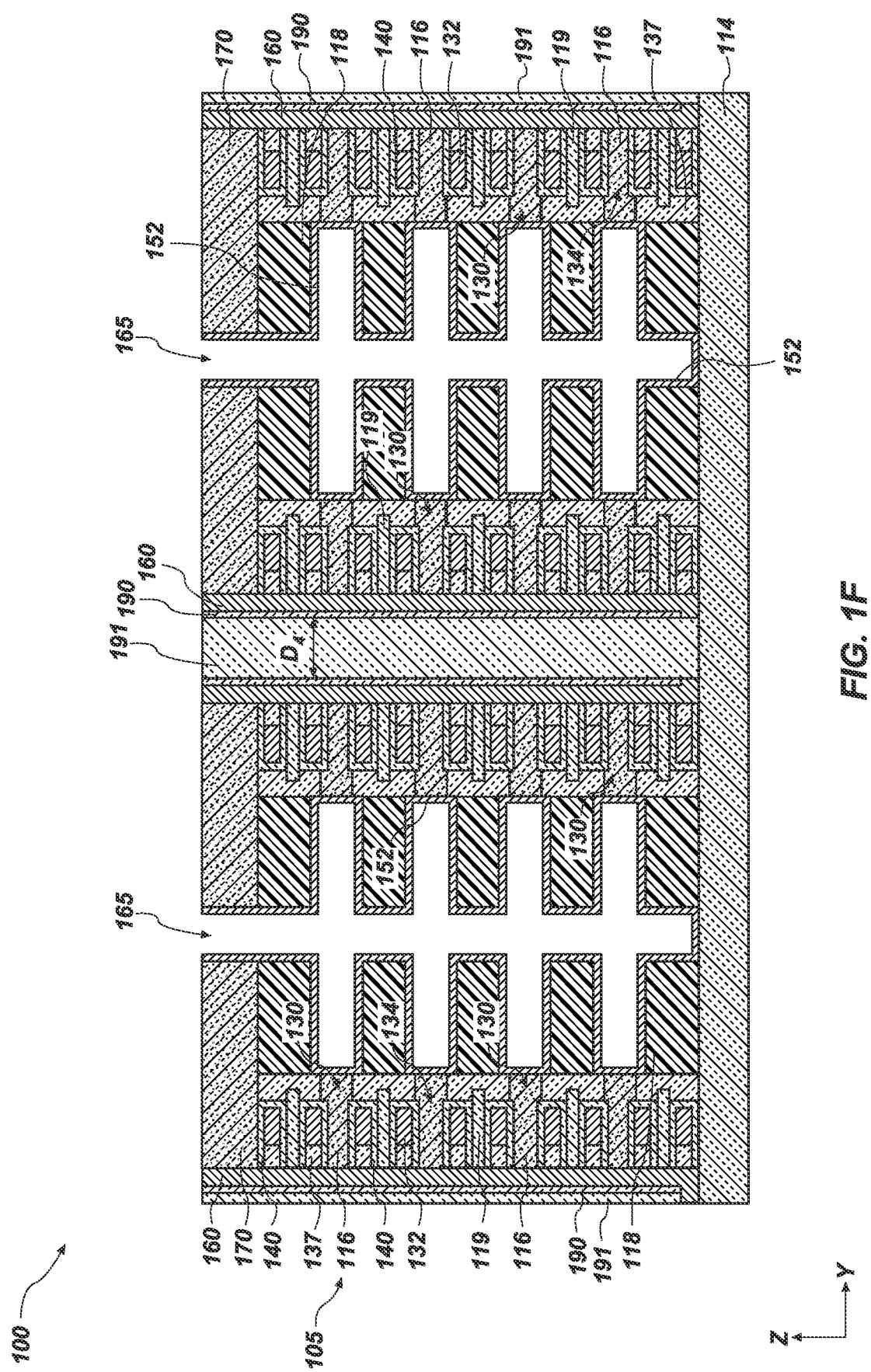

FIG. 1F is a simplified partial cross-sectional view of the first microelectronic device structure 100 at a later processing stage than that illustrated in FIG. 1E and illustrating the same cross-sectional view as that illustrated in FIG. 1E.

With reference to FIG. 1F, the first microelectronic device structure 100 may be further processed to form vertical stacks of memory cells (e.g., memory cells 120 (FIG. 1J through FIG. 1L)) including vertical stacks of storage devices (e.g., storage devices 150 (FIG. 1J through FIG. 1L)) configured to be in electrical communication with the vertical stacks of access devices 130.

In some embodiments, portions of the sixth insulative material 191 and the fifth insulative material 161 (FIG. 1E) may be removed, such as by exposing the first microelectronic device structure 100 to a chemical mechanical planarization (CMP) process. In some embodiments, removing the sixth insulative material 191 and the fifth insulative material 161 exposes a surface of the semiconductive material 170.

Trenches 165 may be formed in regions horizontally between (e.g., in the Y-direction) horizontally neighboring (e.g., in the Y-direction) conductive pillar structures 160 of neighboring openings 159 (FIG. 1D). For example, trenches 165 may be formed through the first microelectronic device structure 100 horizontally between (e.g., in the Y-direction) access devices 130 that are located horizontally between (e.g., in the Y-direction) conductive pillar structures 160. The trenches 165 may be formed vertically through (e.g., in the Z-direction) the semiconductive material 170 and the levels of the first material 116 and the second material 118. In some embodiments, the trenches 165 expose a portion of the first insulative material 114.

After forming the trenches 165, portions of the first material 116 may be removed selective to the second material 118 through the trenches 165. In some embodiments, the first material 116 is selectively removed by exposing the first material 116 to one or both of a dry etch process (e.g., with one or more of sulfur hexafluoride ($SF_6$), hydrogen ($H_2$), and carbon tetrafluoride ($CF_4$)) or a wet etch process (e.g., with one or more quaternary ammonium compounds (e.g., one or more of benzyltrimethyl ammonium hydroxide ($C_{10}H_{17}NO$), methyltriethylammonium hydroxide ($C_7H_{19}NO$), ethyltrimethyl ammonium hydroxide (ETMAH) ($C_5H_{15}NO$), 2-hydroxyethyltrimethyl ammonium hydroxide (also referred to as "choline hydroxide") ($C_5H1_5NO_2$), benzyltriethyl ammonium hydroxide ($C_{10}H_{17}NO$), hexadecyltrimethyl ammonium hydroxide ($C_{19}H_{43}NO$)) and one or more amine compounds (e.g., one or more of N-methylethanolamine (NMEA) ($C_3H_9NO$), monoethanolamine (MEA) ($C_2H_7NO$), diethanolamine (DEA) ($C_4H_{11}NO_2$), triethanolamine (TEA) ($C_6H_{15}NO_3$), triisopropanolamine ($C_9H_{21}NO_3$), 2-(2-aminoethylamino) ethanol ($C_4H_{12}N_2O$), 2-(2-aminoethoxy)ethanol (AEE) ($C_4H_{11}NO_2$), N-ethyl ethanolamine ($C_4H_{11}NO$), N,N-dimethylethanolamine ($C_4H_{11}NO$), N,N-diethyl ethanolamine ($C_6H_{15}NO$), N-methyl diethanolamine (MDEA) ($C_5H_{13}NO_2$), N-ethyl diethanolamine ($C_6H_{15}NO_2$), cyclohexylaminediethanol ($C_{10}H_{21}N$), diisopropanolamine ($C_6H_{15}NO_2$), cyclohexylaminediethanol) ($C_{10}H_{21}N$)). However, the disclosure is not so limited and the first material 116 may be selectively removed with materials and methods other than those described above. In some embodiments, removal of the first material 116 may remove portions of the second material 118 to form voids having a larger vertical dimension (e.g., in the Y-direction) than the first material 116.

After removal of the portions of the first material 116 and the second material 118, a first electrode material 152 may be formed on exposed surfaces within the trenches 165, such as on exposed surfaces of the second material 118, the access devices 130, and a portion of the fourth insulative material 137. In some embodiments, the first electrode material 152 is formed by deposition, such as by ALD.

The first electrode material 152 may be formed of and include conductive material such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium), polysilicon, and other materials exhibiting electrical conductivity. In some embodiments, the first electrode material 152 comprises titanium nitride.

Figure 1G:
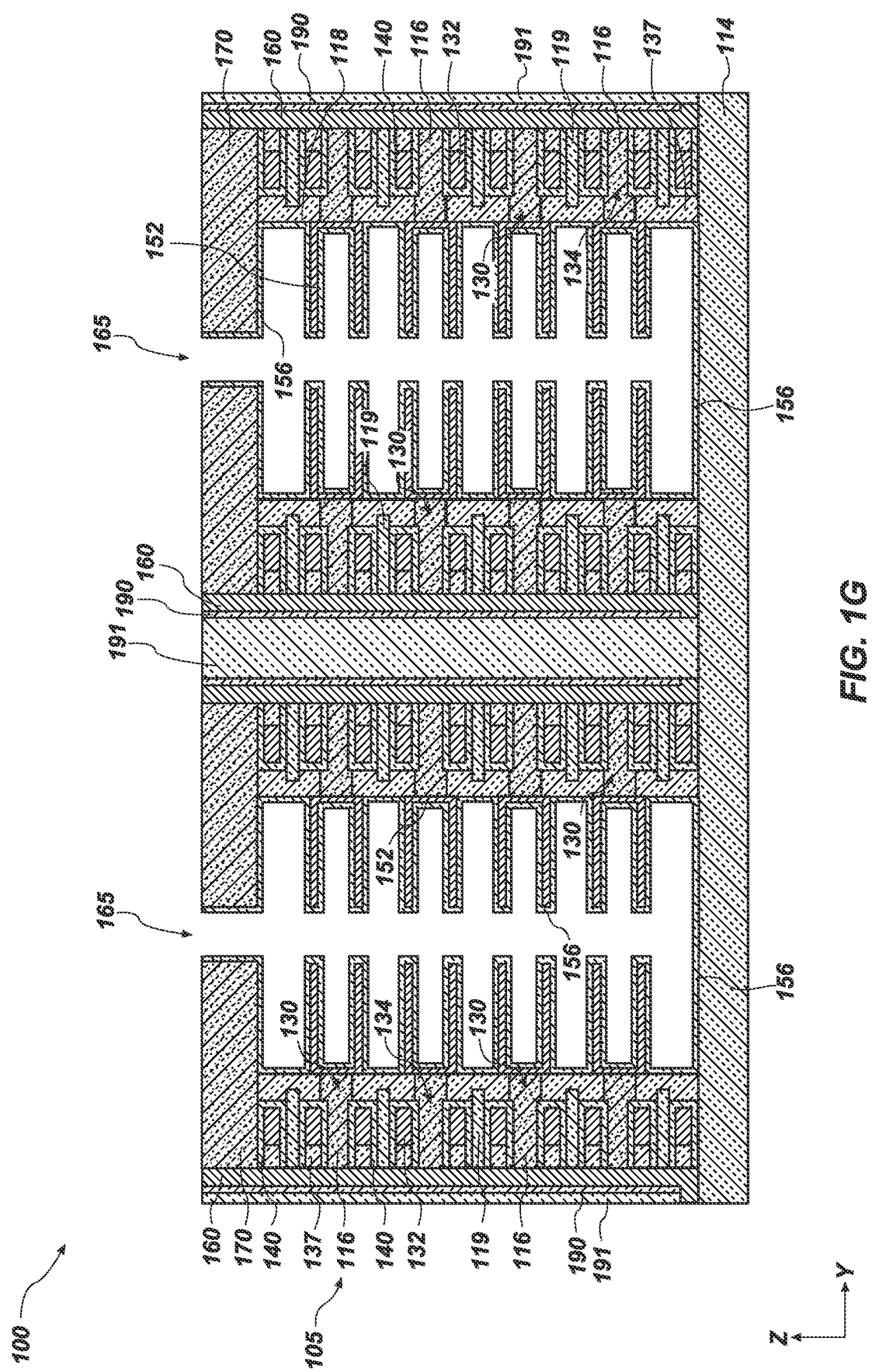

FIG. 1G is a simplified partial cross-sectional view of the first microelectronic device structure 100 at a processing stage after that illustrated in FIG. 1F. FIG. 1G illustrates the same cross-section as that illustrated in FIG. 1F. With reference to FIG. 1G, after forming the first electrode material 152 in the trenches 165, portions of the first electrode material 152 may be removed. For example, vertically extending (e.g., in the Z-direction) portions of the first electrode material 152 on surfaces of the semiconductive material 170 and of the first insulative material 114 may selectively be removed.

After removing the portions of the first electrode material 152, a dielectric material 156 may be formed on exposed surfaces within the trenches 165, such as on exposed surfaces of the first insulative material 114, the first electrode material 152, the fourth insulative material 137, and the semiconductive material 170. In some embodiments, the dielectric material 156 is formed by deposition, such as by ALD.

The dielectric material 156 may be formed of and include one or more of silicon dioxide ($SiO_2$), silicon nitride ($Si_3N_4$), polyimide, titanium dioxide ($TiO_2$), tantalum oxide ($Ta_2O_5$), aluminum oxide ($Al_2O_3$), an oxide-nitride-oxide material (e.g., silicon dioxide-silicon nitride-silicon dioxide), strontium titanate ($SrTiO_3$) (STO), barium titanate ($BaTiO_3$), hafnium oxide ($HfO_2$), zirconium oxide ($ZrO_2$), a ferroelectric material (e.g., ferroelectric hafnium oxide, ferroelectric zirconium oxide, lead zirconate titanate (PZT)), and a high-k dielectric material.

Figure 1H:
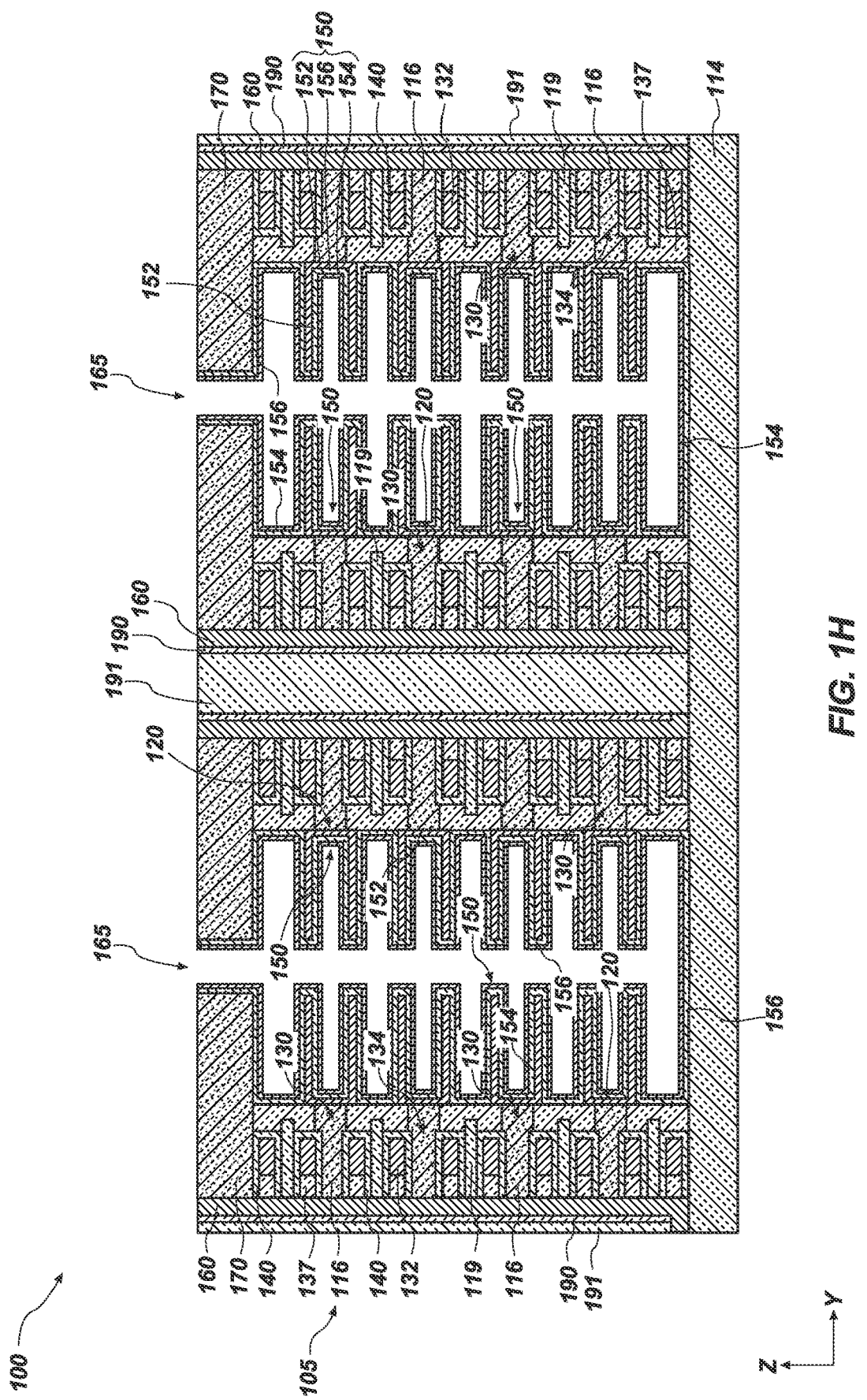

With reference to FIG. 1H, which illustrates the same cross-section as FIG. 1G at a later processing stage than that illustrated in FIG. 1G, after forming the dielectric material 156, a second electrode material 154 may be formed on surfaces of the dielectric material 156 within the trenches 165 to form storage devices 150, each individually comprising the first electrode material 152, the second electrode material 154, and the dielectric material 156 between the first electrode material 152 and the second electrode material 154. Accordingly, each of the storage devices 150 individually comprises a first electrode material 152 (also referred to herein as "a first electrode," "an outer electrode," "a first electrode plate," or a "first node structure"), a second electrode material 154 (also referred to herein as "a second electrode," "an inner electrode," "a second electrode plate," or a "second node structure"), and a dielectric material 156 between the first electrode material 152 and the second electrode material 154. In some such embodiments, the storage devices 150 individually comprise capacitors. However, the disclosure is not so limited and in other embodiments, the storage devices 150 may each individually comprise other structures, such as, for example, phase change memory (PCM), resistance random-access memory (RRAM), conductive-bridging random-access memory (conductive bridging RAM), or another structure for storing a logic state.

In some embodiments, each access device 130 of the vertical stacks of access devices 130 is horizontally neighbored (e.g., in the Y-direction) by a storage device 150 of a corresponding vertical stack of storage devices 150 to form a vertical stack of memory cells 120. Each memory cell 120 comprises one of the storage devices 150 in electrical communication with a horizontally neighboring access device 130. In some embodiments, each memory cell 120 comprises a dynamic random access memory (DRAM) cell. Each memory cell 120 individually comprises a storage device 150 horizontally neighboring an access device 130 of the same level. Accordingly, the vertical stack of memory cells 120 comprises vertically neighboring (e.g., in the Z-direction) levels of memory cells 120, each level of memory cells 120 comprising an access device 130 and a horizontally neighboring storage device 150. In other words, each vertical stack of memory cells 120 comprises vertically spaced (e.g., in the Z-direction) levels of memory cells 120, each vertical level of each vertical stack of memory cells 120 comprising a vertical level of a vertical stack of access devices 130 and a vertical level of a vertical stack of storage devices 150. Stated another way, each vertical stack of memory cells 120 comprises a vertical stack of access devices 130 and a vertical stack of storage devices 150, the storage devices 150 of the vertical stack of storage devices 150 coupled to the access devices 130 of the vertical stack of access devices 130. The vertical stack of access devices 130 may horizontally neighbor (e.g., in the X-direction) the vertical stack of storage devices 150.

The second electrode material 154 may be formed by deposition, such as by ALD. The second electrode material 154 may be formed of and include conductive material, such as one or more of the materials described above with reference to the first electrode material 152. In some embodiments, the second electrode material 154 comprises one or more of the materials described above with reference to the first electrode material 152. In some embodiments, the second electrode material 154 comprises substantially the same material composition as the first electrode material 152.

Figure 1I:
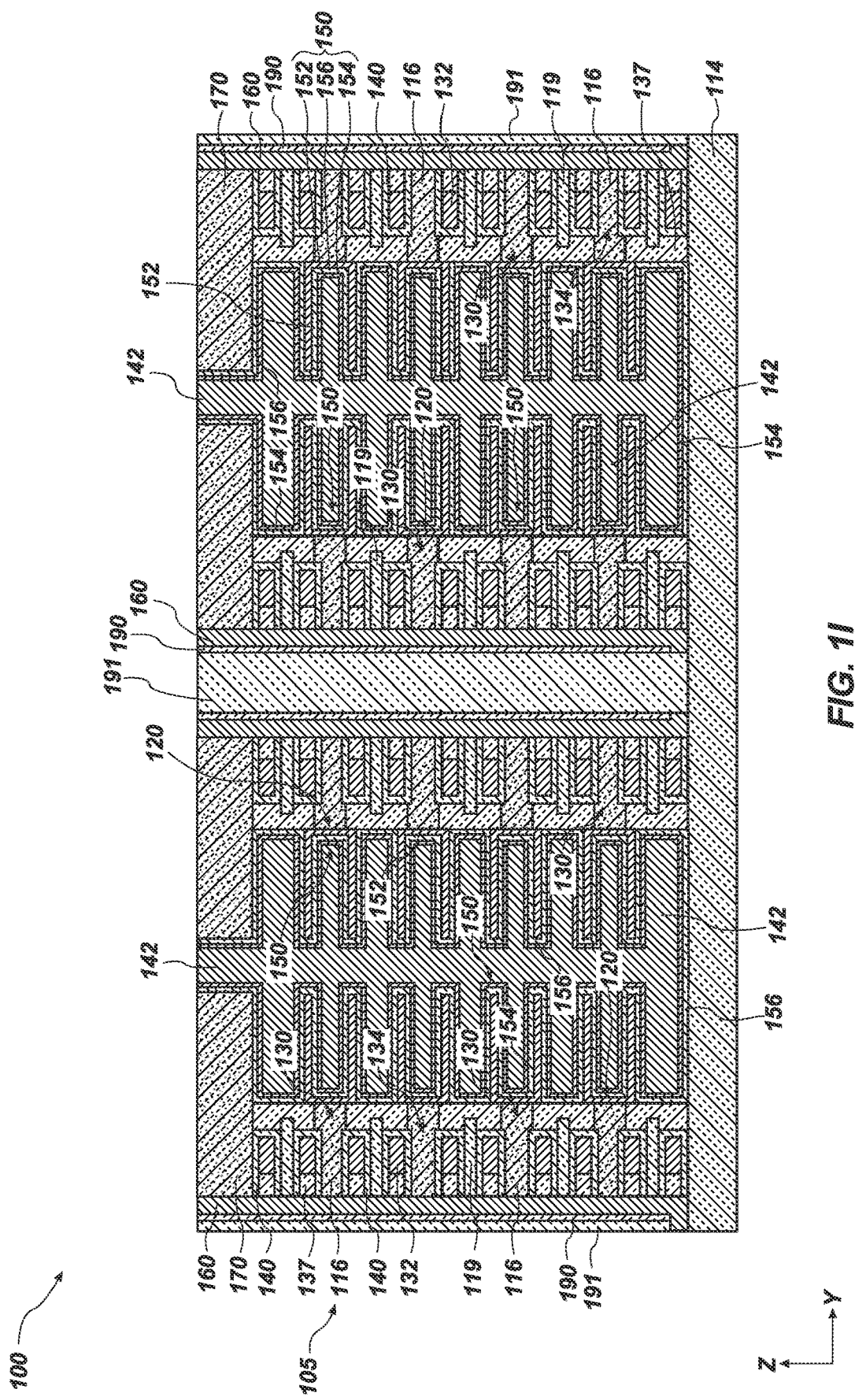

FIG. 1I is a simplified partial cross-sectional view of the first microelectronic device structure 100 at a processing stage after that illustrated in FIG. 1H and illustrates the same cross-section as that illustrated in FIG. 1H. With reference to FIG. 1I, after forming the second electrode material 154 and forming the memory cells 120 comprising the storage devices 150 and the access devices 130, a conductive plate structure 142 may be formed within remaining portions of the trenches 165 (FIG. 1H) and on surfaces of the second electrode material 154.

The conductive plate structures 142 may individually be in electrical communication with the second electrode materials 154 of storage devices 150 of horizontally neighboring vertical stacks of storage devices 150 of horizontally neighboring vertical stacks of memory cells 120. Accordingly, each of the storage devices 150 of the vertical stack of storage devices 150 may be in electrical communication with a conductive plate structure 142 vertically extending (e.g., in the Z-direction) through the first microelectronic device structure 100.

The second electrode material 154 may be in electrical communication with one of the conductive plate structures 142 of a vertical stack of memory cells 120. In some embodiments, the second electrode materials 154 are substantially integral with the conductive plate structures 142. In some embodiments, the second electrode materials 154 of horizontally neighboring (e.g., in the Y-direction) vertical stacks of storage devices 150 are in electrical communication with the same conductive plate structure 142. In some embodiments, and with reference to FIG. 1J, the second electrode materials 154 of horizontally neighboring (e.g., in the X-direction) vertical stacks of storage devices 150 that directly horizontally neighbor (e.g., in the X-direction) one another and are not separated by, for example, an access device 130, are in electrical communication with the same conductive plate structure 142.

In some embodiments, the conductive plate structures 142 are individually formed of conductive material, such as one or more of the materials of the second electrode material 154. In some embodiments, the conductive plate structures 142 comprise substantially the same material composition as the second electrode material 154. In some such embodiments, the conductive plate structures 142 are formed substantially concurrently with formation of the second electrode material 154, which may be formed by, for example, CVD. In other embodiments, the conductive plate structures 142 comprise a different material composition than the second electrode material 154.

Figure 1J:
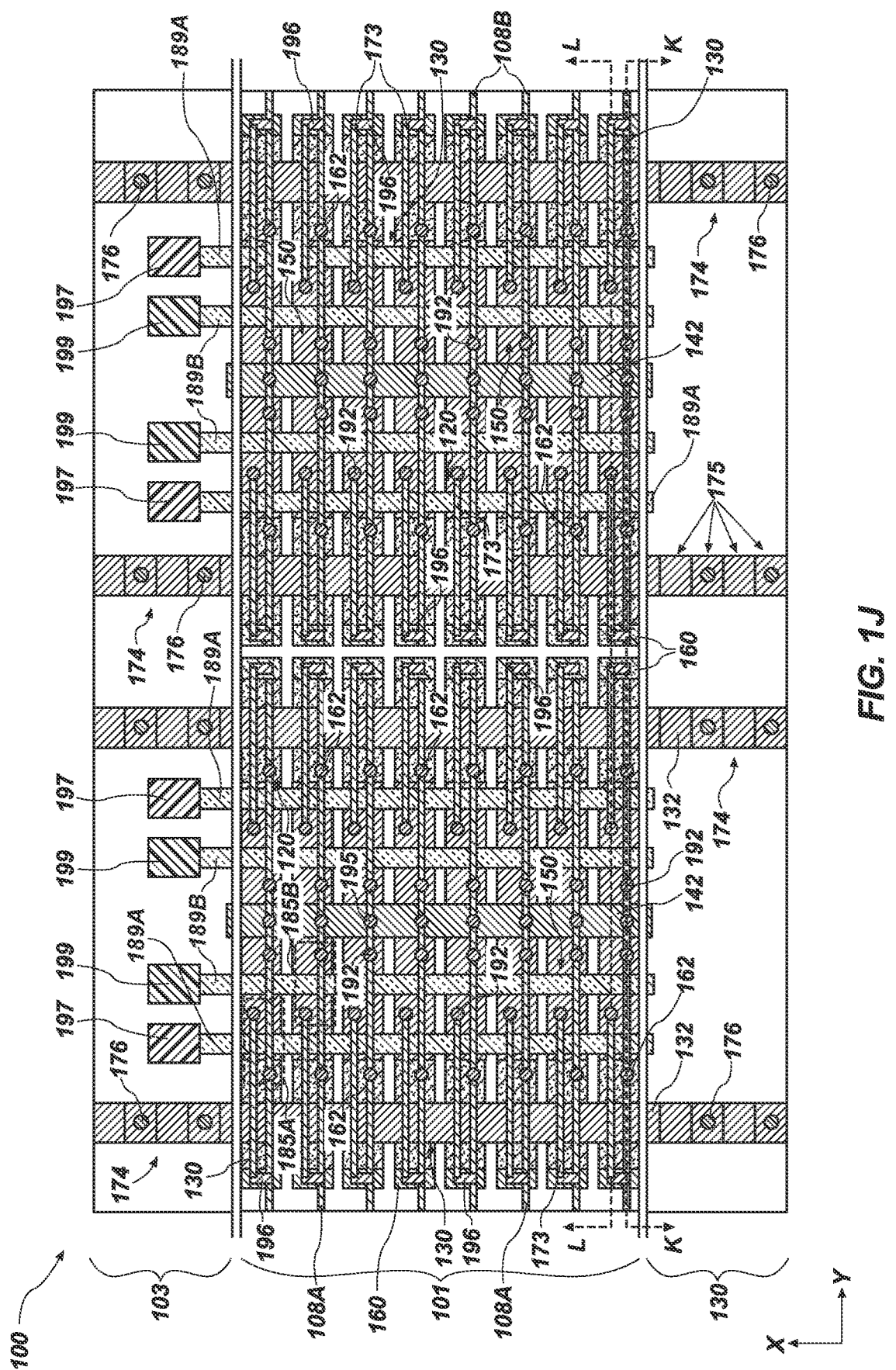

The conductive plate structures 142 may be referred to herein as "conductive plates" or "ground structures." With reference to FIG. 1J, in some embodiments, the conductive plate structures 142 horizontally extend (e.g., in the X-direction) as conductive plates. In some embodiments, the conductive plate structures 142 horizontally extend in substantially the same direction and are substantially parallel to the conductive structures 132. Referring to FIG. 1J, the conductive plate structures 142 may be horizontally between (e.g., in the Y-direction) vertical stacks of memory cells 120, such as between vertical stacks of storage devices 150.

Figure 1K:
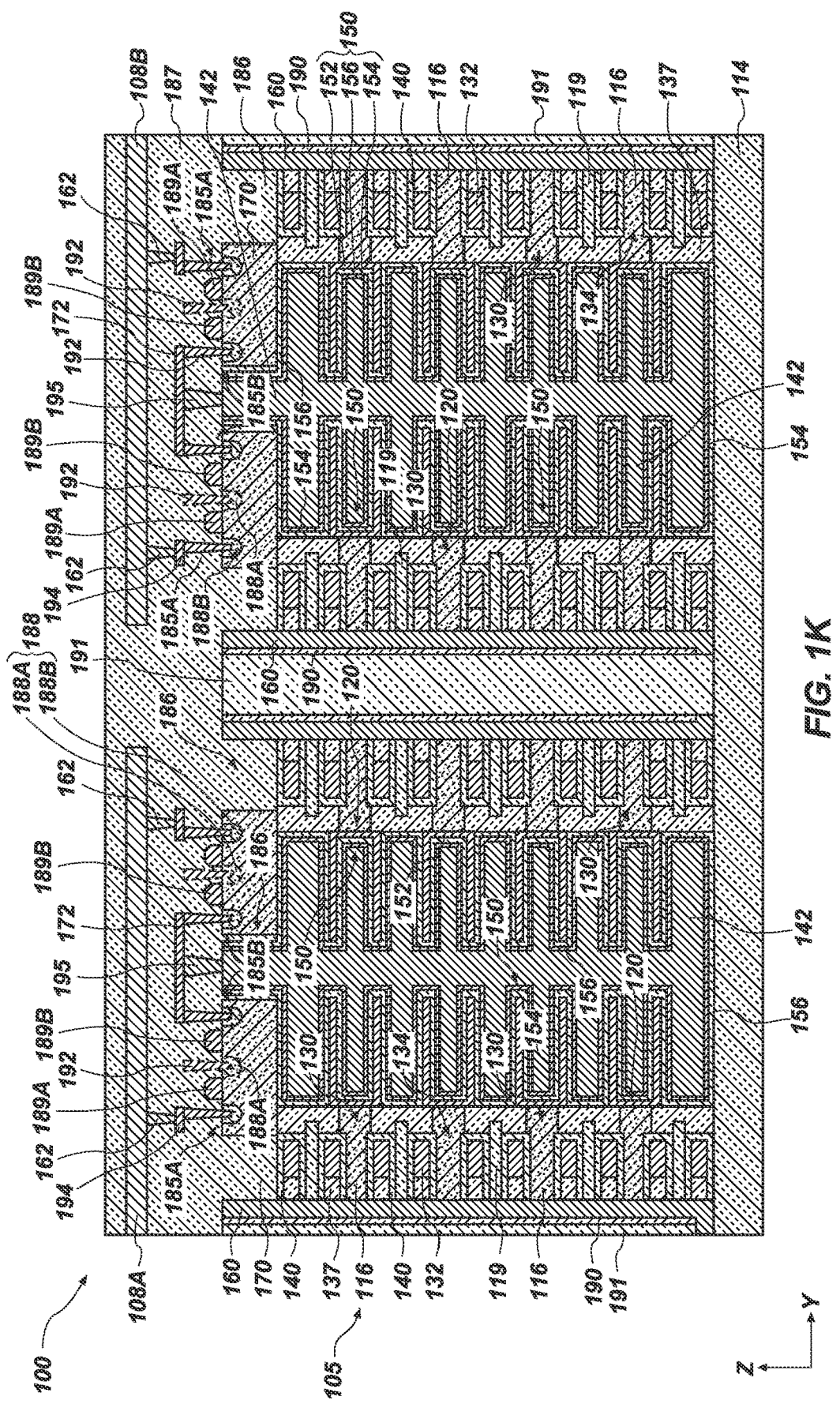
Figure 1L:
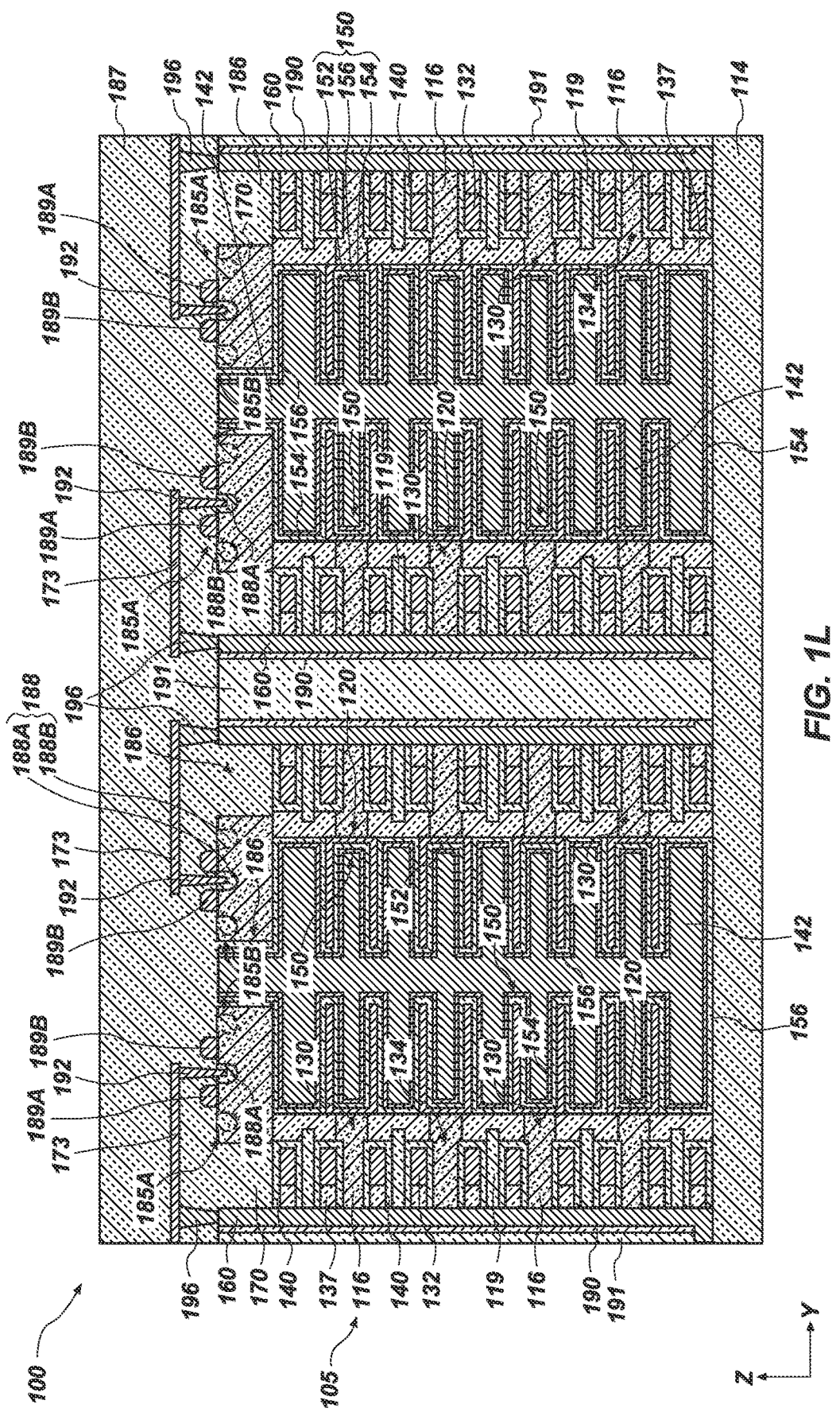

FIG. 1J through FIG. 1L are a simplified partial top down view (FIG. 1J) and simplified partial cross-sectional views (FIG. 1K, FIG. 1L) of the first microelectronic device structure 100 at a processing stage after that illustrated in FIG. 1I. FIG. 1K is a simplified partial cross-sectional view of the first microelectronic device structure 100 taken through section line K-K of FIG. 1J; and FIG. 1L is a simplified partial cross-sectional view of the first microelectronic device structure 100 taken through section line L-L of FIG. 1J.

With reference to FIG. 1K and FIG. 1L, isolation trenches 186 may be formed within the semiconductive material 170 to electrically isolate different portions of the semiconductive material 170 to facilitate formation of transistor structures 185 within a seventh insulative material 187.

The transistor structures 185 may each include conductively doped regions 188, each of which includes a source region 188A and a drain region 188B. Channel regions of the transistor structures 185 may be horizontally interposed between the conductively doped regions 188. In some embodiments, the conductively doped regions 188 of each transistor structure 185 individually comprises one or more semiconductive materials doped with at least one conductivity enhancing chemical species, such as at least one N-type dopant (e.g., one or more of arsenic, phosphorous, antimony, and bismuth) or at least one P-type dopant (e.g., one or more of boron, aluminum, and gallium). In some embodiments, the conductively doped regions 188 comprise conductively doped silicon.

The transistor structures 185 include multiplexers 185A and additional transistors comprising so-called "bleeder" transistors 185B (also referred to as "leaker" transistors). The multiplexers 185A horizontally neighbor (e.g., in the Y-direction) the conductive pillar structures 160 and the bleeder transistors 185B horizontally neighbor (e.g., in the Y-direction) the conductive plate structures 142. The multiplexers 185A and the bleeder transistors 185B each individually comprise a gate structure 189 vertically overlying the semiconductive material 170 and horizontally extending between conductively doped regions 188. The gate structure 189 of the multiplexers 185A comprises multiplexer gates 189A and the gate structure 189 of the bleeder transistors 185B comprises bleeder gates 189B. One of the multiplexers 185A is illustrated in box 185A in FIG. 1J and one of the bleeder transistors 185B is illustrated in box 185B in FIG. 1J.

In FIG. 1K, the source regions 188A are illustrated in broken lines to indicate that the source regions 188A are located in a different plane than that of FIG. 1K. With reference to FIG. 1L, the drain regions 188B are illustrated in broken lines to indicate that they are located in a different plane than that illustrated in FIG. 1L. With reference to FIG. 1J, the source regions 188A are horizontally offset (e.g., in the X-direction, in the Y-direction) from the drain regions 188B. With collective reference to FIG. 1J and FIG. 1K, in some embodiments, the drain regions 188B of the multiplexers 185A and the drain regions 188B of the bleeder transistors 185B are horizontally aligned (e.g., in the X-direction), such as with a vertically overlying (e.g., in the Z-direction) global digit line 108.

In some embodiments, each multiplexer 185A horizontally neighbors (e.g., in the X-direction, in the Y-direction) one of the bleeder transistors 185B. In some embodiments, two bleeder transistors 185B horizontally intervene (e.g., in the Y-direction) between horizontally neighboring multiplexers 185A. In some embodiments, a conductive plate structure 142 may be located between horizontally neighboring (e.g., in the Y-direction) conductive pillar structures 160. Two multiplexers 185A may horizontally intervene (e.g., in the Y-direction) between the conductive pillar structures 160 and two bleeder transistors 185B may be horizontally intervene between the multiplexers 185A. In some such embodiments, the multiplexers 185A may be located closer to the conductive pillar structures 160 than the bleeder transistors 185B and the bleeder transistors 185B may be closed to the conductive plate structure 142 than the multiplexers 185A.

In some embodiments, the source region 188A of the multiplexer 185A is shared with the horizontally neighboring bleeder transistor 185B. Stated another way, each multiplexer 185A comprises a source region 188A that is shared with a source region 188A of the horizontally neighboring bleeder transistor 185B. In other words, the source region 188A of the multiplexer 185A comprises the source region 188A of the bleeder transistor 185B. In some such embodiments, the multiplexers 185A and the horizontally neighboring bleeder transistor 185B may be referred to as "shared source" transistors.

In some embodiments, each of the source regions 188A and the drain regions 188B are individually in electrical communication with first conductive interconnect structures 192. The first conductive interconnect structures 192 may individually electrically couple the source regions 188A and the drain regions 188B to one or more additional conductive structures, as described in further detail herein.

Each of the multiplexer gates 189A and the bleeder gates 189B may individually be horizontally aligned (e.g., in the Y-direction) with and shared by the channel regions of multiple transistor structures 185 (e.g., multiplexers 185A, bleeder transistors 185B) horizontally neighboring (e.g., in the X-direction (FIG. 1A)) one another. In some such embodiments, and as illustrated in FIG. 1J, the gate structures 189 extend in a first horizontal direction (e.g., in the X-direction). In addition, dielectric material (also referred to herein as a "gate dielectric material") may be vertically interposed between the gate structures 190 and portions of the semiconductive material 170 at least partially defining the channel regions of the transistor structures 185.

With reference to FIG. 1J, the multiplexer gates 189A horizontally extend (e.g., in the X-direction) and are in electrical communication with a multiplexer driver 197. The multiplexer driver 197 may include circuitry configured to drive the multiplexers 185A by means of the multiplexer gates 189A. The bleeder gates 189B may horizontally extend (e.g., in the X-direction) and be in electrical communication with a bleeder driver 199 including circuitry configured to driver the bleeder transistors 185B by means of the bleeder gates 189B. In some embodiments, each of the multiplexer drivers 197 and the bleeder drivers 199 are located in the peripheral region 103 of the first microelectronic device structure 100. In some embodiments, the multiplexer drivers 197 and the bleeder drivers 199 are located within horizontal boundaries (e.g., in the X-direction) of the staircase structures 174.

With reference to FIG. 1K, global digit line contact structures 162 may be formed in electrical communication with the multiplexers 185A by means of first routing structures 194 in electrical communication with a first conductive interconnect structure 192 that is, in turn, in electrical communication with a drain region 188B of the multiplexer 185A. The global digit line contact structures 162 are individually in electrical communication with one of the global digit lines 108. In some embodiments, each global digit line 108 is configured to be in electrical communication with more than one vertical stacks of memory cells 120 (e.g., more than one conductive pillar structure (local digit line) 160 of different vertical stacks of memory cells 120). In some such embodiments, the global digit lines 108 are individually configured to be in electrical communication with more than one of the global digit line contact structures 162.

The global digit lines 108 may also be referred to as "conductive lines." The global digit lines 108 may be formed vertically over (e.g., in the Z-direction) and in electrical communication with the global digit line contact structures 162. With collective reference to FIG. 1J and FIG. 1K, the global digit lines 108 are located within the array region 101 and extend in a horizontal direction (e.g., the Y-direction) substantially perpendicular to the conductive structures 132. The global digit lines 108 may terminate at horizontally terminal ends (e.g., in the Y-direction) of the array region 101.

With continued reference to FIG. 1K, the global digit lines 108 may vertically overlie (e.g., in the Z-direction) the vertical stacks of memory cells 120 and the semiconductive material 170 including the multiplexers 185A and the bleeder transistors 185B. In some embodiments, the multiplexers 185A and the bleeder transistors 185B vertically intervene (e.g., in the Z-direction) between the global digit lines 108 and the vertical stacks of memory cells 120 and the vertical stacks of conductive structures 132.

The global digit lines 108 include first global digit lines 108A and second global digit lines 108B. The first global digit lines 108A may be referred to herein as "through global digit lines" and the second global digit lines 108B may be referred to herein as "reference global digit lines." The first global digit lines 108A and the second global digit lines 108B may collectively be referred to herein as "global digit lines." In some embodiments, the first global digit lines 108A are located on a first horizontal end (e.g., in the Y-direction) of the first microelectronic device structure 100 and the second global digit lines 108B are located on a second horizontal end (e.g., in the Y-direction) of the first microelectronic device structure 100 opposite the first horizontal end. For example, in the view illustrated in FIG. 1A, the first global digit lines 108A may be located in the upper horizontal half (e.g., in the Y-direction) of the array region 101 and the second global digit lines 108B may be located in a lower horizontal half (e.g., in the Y-direction) of the array region 101.

Each of the global digit lines 108 and the global digit line contact structures 162 may individually be formed of and include conductive material, such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide (IrO$_x$), ruthenium oxide (RuO$_x$), alloys thereof, a conductively doped semiconductor material (e.g., conductively doped silicon, conductively doped germanium, conductively doped silicon germanium, etc.), polysilicon, or other materials exhibiting electrical conductivity. In some embodiments, the global digit lines 108 and the global digit line contact structures 162 individually comprise tungsten. In other embodiments, the global digit lines 108 and the global digit line contact structures 162 individually comprise copper.

In some embodiments, the drain regions 188B of the multiplexers 185A and the bleeder transistors 185B may be horizontally aligned (e.g., in the X-direction) with the global digit line 108 vertically overlying (e.g., in the Z-direction) the multiplexers 185A and the bleeder transistors 185B. In some embodiments, the source regions 188A may be horizontally offset (e.g., in the X-direction) from the vertically overlying global digit line 108.

Still referring to FIG. 1K, the conductive plate structures 142 are individually in electrical communication with a second conductive interconnect structure 195. The second conductive interconnect structure 195 is, in turn, in electrical communication with a second routing structure 172. The second routing structure 172 is in electrical communication with first conductive interconnect structures 192 that are each, in turn, in electrical communication with the drain regions 188B of the bleeder transistors 185B. Accordingly, the drain regions 188B of the bleeder transistors 185B horizontally neighboring (e.g., in the Y-direction) the conductive plate structures 142 are in electrical communication with the conductive plate structures 142 by means of the first conductive interconnect structures 192, the second routing structure 172, and the second conductive interconnect structures 195. The second routing structures 172 are not illustrated in the top-down view of FIG. 1J for clarity and ease of understanding the description, but it will be understood that the second routing structures horizontally extend (e.g., in the Y-direction) and are substantially parallel with the global digit lines 108.

With reference to FIG. 1L, the shared source regions 188A may be in electrical communication with a first conductive interconnect structure 192 that is, in turn, in electrical communication with a third routing structure 173. The third routing structures 173 horizontally extend (e.g., in the Y-direction) between the first conductive interconnect structure 192 in electrical communication with the source region 188A and a third conductive interconnect structure 196 that is in electrical communication with the conductive pillar structure 160. Accordingly, in some embodiments, the conductive pillar structures 160 are in electrical communication with the source regions 188A of the multiplexers 185A by means of the third conductive interconnect structure 196, the third routing structure 173, and the first conductive interconnect structure 192.

In some embodiments, the multiplexers 185A may be configured to selectively place the vertical stacks of memory cells 120 in electrical communication with a global digit line 108 by means of a global digit line contact structure 162. By way of non-limiting example, a select voltage may be applied to the multiplexer gate 189A to electrically connect the global digit line 108 to a vertical stack of memory cells 120 associated with the multiplexer 185A comprising the multiplexer gate 189A. Application of the select voltage to the multiplexer gate 189A may place the conductive pillar structure 160 of the selected vertical stack of memory cells 120 in electrical communication with the global digit line 108 in electrical communication with the conductive pillar structure 160. Accordingly, the conductive pillar structure 160 (e.g., the local digit line) of each vertical stack of memory cells 120 may selectively be coupled to the global digit line 108 by means of the multiplexer 185A between the conductive pillar structure 160 and the global digit line 108.

Each global digit line 108 may be configured to be selectively coupled to more than one of the conductive pillar structures 160 by means of the multiplexers 185A coupled to global digit lines 108. Each of the multiplexers 185A is configured to be in electrical communication with the global digit line 108 and one of the multiplexers 185A by means of one of the global digit line contact structures 162. In some embodiments, each global digit line 108 is configured to selectively be in electrical communication with four (4) of the conductive pillar structures 160, each one of which is associated with a vertical stack of memory cells 120. In other embodiments, each of the global digit lines 108 is configured to selectively be in electrical communication with eight (8) of the conductive pillar structures 160 or sixteen (16) of the conductive pillar structures 160. In use and operation, application of a voltage to the multiplexer gate 189A induces a current in the channel region of the multiplexer 185A and electrically connects the global digit line 108 (e.g., by means of the global digit line contact structure 162, the first routing structure 194, one of the first conductive interconnect structures 192, and the drain region 188B of the multiplexer 185A) to the conductive pillar structure 160 (e.g., by means of the source region 188A of the multiplexer 185A, the first conductive interconnect structure 192 in electrical communication with the source region 188A, the third routing structure 173, and the third conductive interconnect structure 196). Accordingly, in some embodiments, the multiplexers 185A are individually configured to receive a signal (e.g., a select signal) from a multiplexer driver 197 and provide the signal to a bit line (e.g., conductive pillar structures 160 (FIG. 1L)) to selectively access desired memory cells 120 within the array region 101 for effectuating one or more control operations of the memory cells 120.

The bleeder transistors 185B may be configured to provide a bias voltage from the conductive plate structure 142 on the source region 188A of multiplexers 185A of unselected vertical stacks of memory cells 120. For example, as described above, a particular vertical stack of memory cells 120 may be selected to be in electrical communication with a global digit line 108 by means of a multiplexer 185A in electrical communication with the global digit line 108 through a global digit line contact structure 162. The global digit line 108 may be configured to be in electrical communication with additional vertical stacks of memory cells 120 by means of additional multiplexers 185A configured to be electrically connect the global digit line 108 with the additional vertical stacks of memory cells 120. The bleeder transistors 185B may be configured to place the source regions 188A of the transistor structures 185 (e.g., the multiplexers 185A) of unselected vertical stacks of memory cells 120 (e.g., vertical stacks of memory cells 120 not in electrical communication with the global digit line 108, such as memory cells 120 of a vertical stack in which a select voltage is not applied to the multiplexer 185A) in electrical communication with a voltage from the conductive plate structure 142. In some embodiments, the conductive plate structure 142 may be configured to provide a negative voltage (e.g., a drain voltage $V_{dd}$ or a voltage source supply $V_{ss}$) to the source region 188A of multiplexers 185A of unselected vertical stacks of memory cells 120. In some embodiments, providing the voltage from the conductive plate structure 142 on the source regions 188A may reduce interference from unselected memory cells 120 during operation of the vertical stacks of memory cells 120, such as by providing the voltage of the conductive plate structure 142 to the conductive pillar structure 160 of unselected vertical stacks of memory cells 120. In other words, the bleeder transistors 185B are configured to electrically connect unselected conductive pillar structures 160 to their respective conductive plate structures 142 (e.g., ground structures, cell plates), which may be coupled to a negative voltage. In some embodiments, each vertical stack of memory cells 120 includes at least one (e.g., one) of the multiplexers 185A and at least one (e.g., one) of the bleeder transistors 185B.

Each of the gate structures 189, the first conductive interconnect structure 192, the second conductive interconnect structures 195, the third conductive interconnect structures 196, the first routing structures 194, the second routing structures 172, and the third routing structures 173 may individually be formed of and include conductive material, such as one or more of the materials described above with reference to the global digit lines 108. In some embodiments, the gate structures 189, the first conductive interconnect structure 192, the second conductive interconnect structures 195, the third conductive interconnect structures 196, the first routing structures 194, the second routing structures 172, and the third routing structures 173 are individually formed of and include tungsten. In other embodiments, the gate structures 189, the first conductive interconnect structure 192, the second conductive interconnect structures 195, the third conductive interconnect structures 196, the first routing structures 194, the second routing structures 172, and the third routing structures 173 are individually formed of and include copper.

In some embodiments, each of the global digit lines 108, the global digit line contact structures 162, the gate structures 189, the first conductive interconnect structure 192, the second conductive interconnect structures 195, the third conductive interconnect structures 196, the first routing structures 194, the second routing structures 172, and the third routing structures 173 are formed in the seventh insulative material 187.

The seventh insulative material 187 may be formed of and include insulative material, such as one or more of the materials described above with reference to the first insulative material 114. In some embodiments, the seventh insulative material 187 is formed of and includes silicon dioxide.

Although the vertical stacks of memory cells 120 have been illustrated as comprising four (4) levels of the memory cells 120, the disclosure is not so limited. The vertical stacks of memory cells 120 may include a desired quantity of the levels of the memory cells 120, such as within a range from thirty-two (32) of the levels of the memory cells 120 to two hundred fifty-six (256) of the levels of the memory cells 120, as described above with reference to the quantity of the steps 175 of the staircase structures 174.

Although FIG. 1J illustrates thirty-two (32) vertical stacks of memory cells 120 (e.g., eight (8) rows and four (4) columns of vertical stacks of memory cells 120), the disclosure is not so limited, and the array region 101 may include greater than thirty-two vertical stacks of memory cells 120. For example, the first microelectronic device structure 100 may include a greater quantity of columns of the vertical stacks of memory cells 120, a greater quantity of the rows of the vertical stacks of memory cells 120, or both.

Figure 2A:
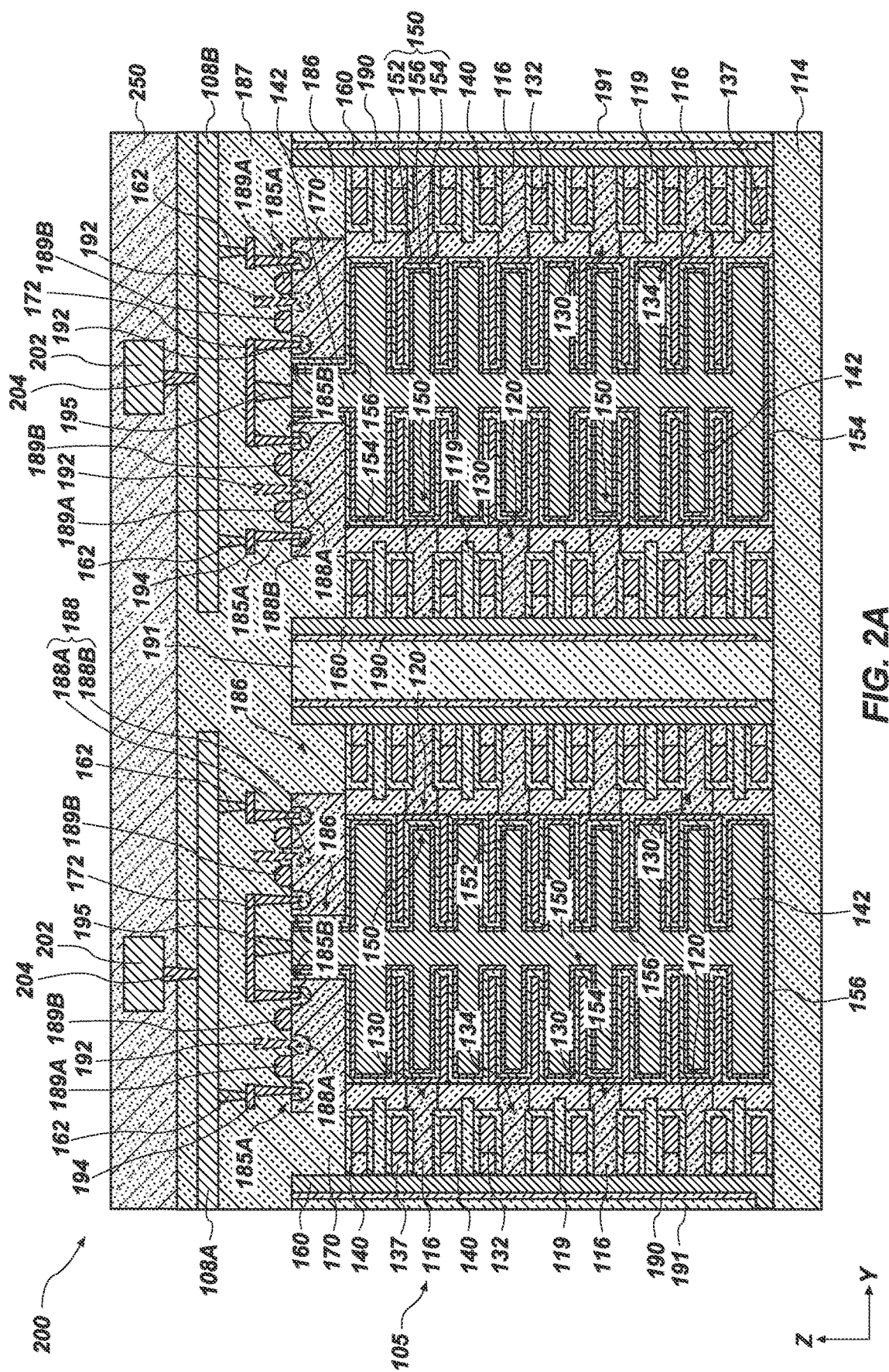
FIG. 2A and FIG. 2B are simplified partial cross-sectional views of a microelectronic device formed from the first microelectronic device structure and a second microelectronic device structure, in accordance with embodiments of the disclosure.
Figure 2B:
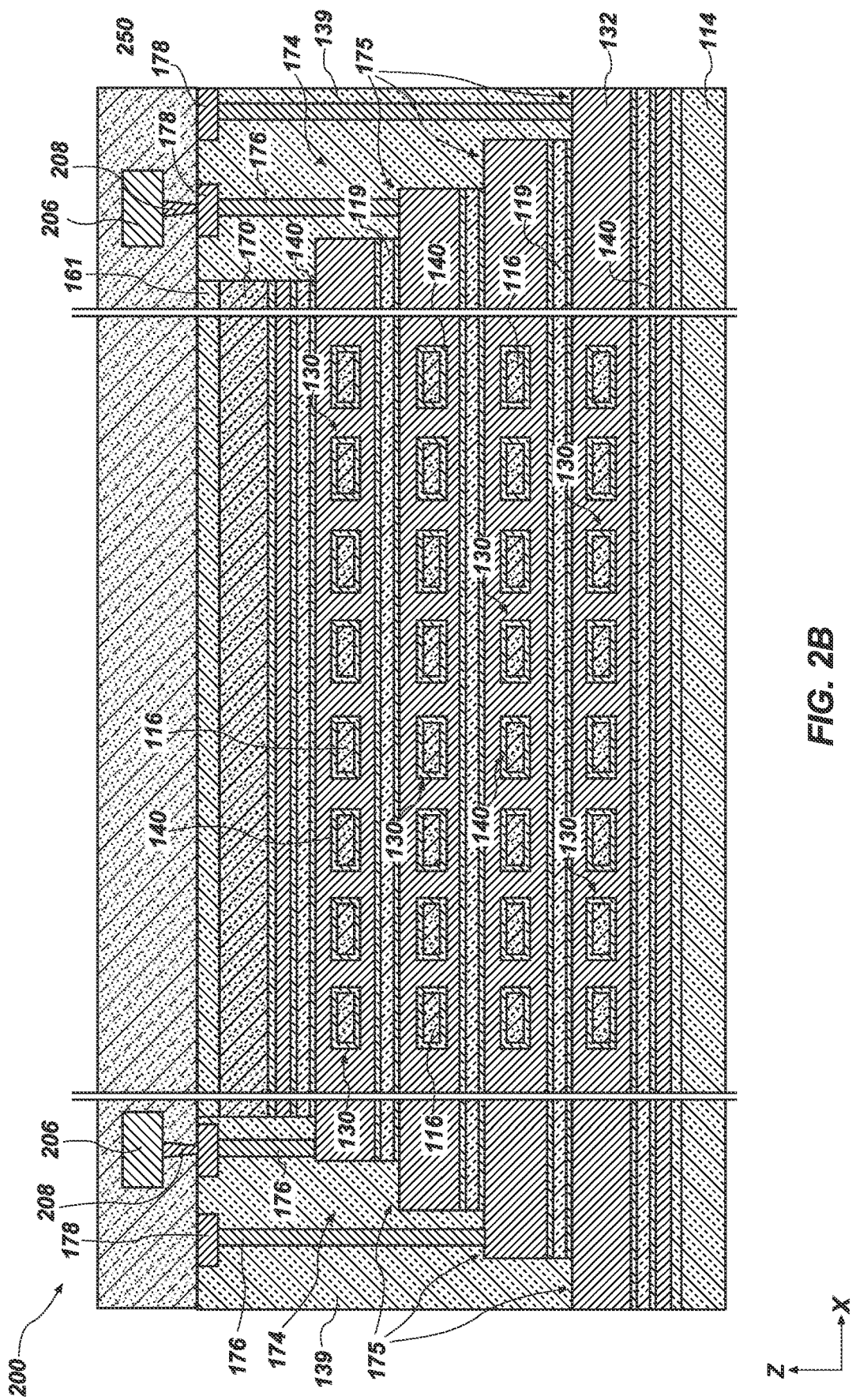

FIG. 2A and FIG. 2B are simplified partial cross-sectional views illustrating a microelectronic device 200 formed from the first microelectronic device structure 100 and a second microelectronic device structure 250 after attaching the second microelectronic device structure 250 to the first microelectronic device structure 100. FIG. 2A is a simplified cross-sectional view of the microelectronic device 200 and illustrates the same cross-sectional view of the first microelectronic device structure 100 illustrated in FIG. 1K. FIG. 2B is a simplified cross-sectional view of the microelectronic device 200 and illustrates the same cross-sectional view of the first microelectronic device structure 100 illustrated in FIG. 1C.

By way of non-limiting example, the second microelectronic device structure 250 may be attached to the first microelectronic device structure 100 by oxide-to-oxide bonding. In some such embodiments, an oxide material of the second microelectronic device structure 250 is brought into contact with an oxide material of the first microelectronic device structure 100 and the first microelectronic device structure 100 and the second microelectronic device structure 250 are exposed to annealing conditions to form bonds (e.g., oxide-to-oxide bonds) between the oxide material of the first microelectronic device structure 100 and the oxide material of the second microelectronic device structure 250.

The second microelectronic device structure 250 may include control logic devices (e.g., CMOS devices) and circuitry configured for effectuating control operations for the memory cells 120. By way of non-limiting example, the second microelectronic device structure 250 may include one or more sub word line driver regions, one or more socket regions, and one or more additional CMOS regions including one or more of (e.g., all of) one or more sense amplifier devices (e.g., equalization (EQ) amplifiers, isolation (ISO) amplifiers, NMOS sense amplifiers (NSAs), PMOS sense amplifiers (PSAs)), column decoders, multiplexer control logic devices, sense amplifier drivers, main word line driver devices, row decoder devices, and row select devices.

With reference to FIG. 2A, the second microelectronic device structure 250 may include one or more sense amplifier device regions 202 vertically overlying (e.g., in the Z-direction) and within horizontal boundaries of the vertical stacks of memory cells 120. The sense amplifier device regions 202 may include transistor structures in electrical communication with the global digit lines 108 by means of fourth conductive interconnect structures 204. In some embodiments, the sense amplifier device regions 202 include sense amplifier devices (e.g., equalization (EQ) amplifiers, isolation (ISO) amplifiers, NMOS sense amplifiers (NSAs), PMOS sense amplifiers (PSAs)).

With reference to FIG. 2B, the second microelectronic device structure 250 may include one or more sub word line driver regions 206 vertically overlying (e.g., in the Z-direction) and within horizontal boundaries of the staircase structures 174, such as vertically overlying the conductive contact structures 176 and the pad structures 178. The sub word line driver regions 206 may include transistor structures in electrical communication with the conductive structures 132 by means of fifth conductive interconnect structures 208 that are in electrical communication with the pad structures 178.

Each of the fourth conductive interconnect structures 204 and the fifth conductive interconnect structures 208 are individually formed of and include conductive material, such as one or more of the conductive materials described above with reference to the first conductive interconnect structures 192. In some embodiments, the fourth conductive interconnect structures 204 and the fifth conductive interconnect structures 208 individually comprise tungsten. In other embodiments, the fourth conductive interconnect structures 204 and the fifth conductive interconnect structures 208 individually comprise copper.

Thus, in accordance with some embodiments, a microelectronic device comprises vertical stacks of memory cells, each vertical stack of memory cells comprising a vertical stack of access devices, a vertical stack of capacitors horizontally neighboring the vertical stack of access devices, and a conductive pillar structure vertically extending through the vertical stack of access devices. The microelectronic device further comprises multiplexers and additional transistors vertically overlying the vertical stacks of memory cells, and global digit lines vertically overlying the multiplexer and the additional transistor.

Furthermore, in accordance with additional embodiments of the disclosure, a microelectronic device comprises vertical stacks of dynamic random access memory (DRAM) cells, each DRAM cell comprising a storage device horizontally neighboring an access device, at least one multiplexer vertically overlying at least one of vertical stacks of DRAM cells, and at least one additional transistor structure vertically overlying the at least one of the vertical stacks of DRAM cells and horizontally neighboring the at least one multiplexer, the at least one multiplexer and the at least one additional transistor structure sharing a source region.

Moreover, in accordance with some embodiments of the disclosure, a method of forming a microelectronic device comprises forming a conductive material in an opening vertically extending through vertical stacks of access devices horizontally neighboring one another to form a conductive pillar structure in electrical communication with the access devices of each of the vertical stack of access devices, forming an insulative liner material over the conductive material in the opening, removing a lower portion of the insulative liner material and the conductive material at the lower portion of the opening to form isolated conductive pillar structures individually in electrical communication with one of the vertical stacks of access devices, forming trenches through a stack structure of vertically alternating first materials and second materials on a side of each of the vertical stacks of access devices opposite the conductive pillar structure, forming vertical stacks of capacitor structures in the trenches to form vertical stacks of memory cells, each vertical stack of memory cells comprising a vertical stack of capacitor structures in electrical communication with a vertical stack of access devices, and forming a multiplexer and at least one additional transistor vertically over each of the vertical stack of memory cells.

Figure 3:
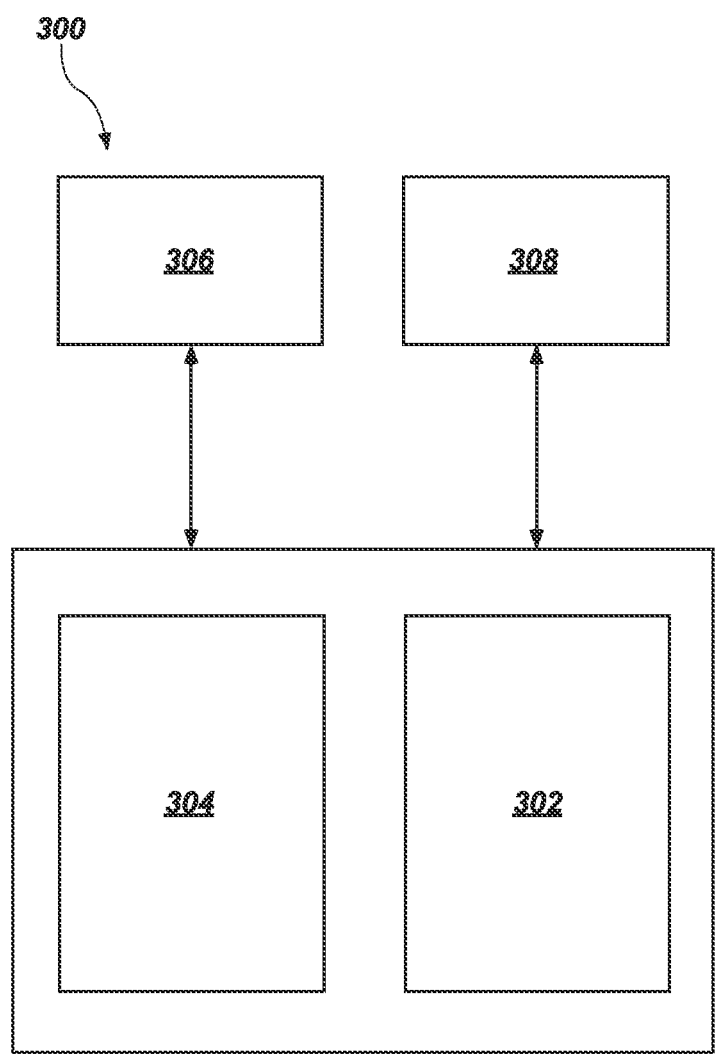
FIG. 3 is a schematic block diagram of an electronic system, in accordance with an embodiment of the disclosure.

Structures, assemblies, and devices in accordance with embodiments of the disclosure may be included in electronic systems of the disclosure. For example, FIG. 3 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, an embodiment of one or more of a microelectronic device structure, a microelectronic device structure assembly, a relatively larger microelectronic device structure assembly, and a microelectronic device previously described herein with reference to FIG. 1A through FIG. 2B. The electronic system 300 may further include at least one electronic signal processor device 304 (often referred to as a "microprocessor"). The electronic signal processor device 304 may, optionally, include an embodiment of one or more of a microelectronic device structure, a microelectronic device structure assembly, a relatively larger microelectronic device structure assembly, and a microelectronic device previously described herein with reference to FIG. 1A through FIG. 2B. While the memory device 302 and the electronic signal processor device 304 are depicted as two (2) separate devices in FIG. 3, in additional embodiments, a single (e.g., only one) memory/processor device having the functionalities of the memory device 302 and the electronic signal processor device 304 is included in the electronic system 300. In such embodiments, the memory/processor device may include one or more of a microelectronic device structure, a microelectronic device structure assembly, a relatively larger microelectronic device structure assembly, and a microelectronic device previously described herein with reference to FIG. 1A through FIG. 2B. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, one or more of a monitor, a display, a printer, an audio output jack, and a speaker. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably coupled to the input device and the output device, and a memory device operably coupled to the processor device. The memory device comprises a vertical stack of capacitor structures horizontally neighboring a vertical stack of access devices, a conductive plate structure in electrical communication with an electrode of each of the capacitor structures, a conductive pillar structure in electrical communication with the vertical stack of access devices, an additional vertical stack of capacitor structures comprising additional electrodes in electrical communication with the conductive pillar structure, the conductive plate structure horizontally intervening between the additional vertical stack of capacitor structures and the vertical stack of capacitor structures, and a multiplexer and a bleeder transistor vertically overlying the vertical stack of capacitor structures and the vertical stack of access devices.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
vertical stacks of memory cells, each vertical stack of memory cells comprising:
a vertical stack of access devices;
a vertical stack of capacitors horizontally neighboring the vertical stack of access devices; and
a conductive pillar structure vertically extending through the vertical stack of access devices;
multiplexers and additional transistors vertically overlying the vertical stacks of memory cells; and
global digit lines vertically overlying the multiplexer and the additional transistors.

2. The microelectronic device of claim 1, wherein each multiplexer individually shares a source region with one of the additional transistors.

3. The microelectronic device of claim 1, further comprising a conductive plate structure vertically extending through the vertical stacks of memory cells and neighboring the vertical stacks of capacitors of the vertical stacks of memory cells.

4. The microelectronic device of claim 3, wherein pairs of the additional transistors are in electrical communication with the conductive plate structure.

5. The microelectronic device of claim 1, wherein:
one of the multiplexers vertically overlies each vertical stack of memory cells; and
two multiplexers are located between horizontally neighboring conductive pillar structures of horizontally neighboring vertical stacks of memory cells.

6. The microelectronic device of claim 1, wherein horizontally neighboring multiplexers are individually in electrical communication with a respective conductive pillar structure vertically extending through a respective vertical stacks of memory cells.

7. The microelectronic device of claim 1, further comprising a vertical stack of conductive structures intersecting multiple of the vertical stacks of memory cells.

8. The microelectronic device of claim 7, wherein each conductive structure of the vertical stack of conductive structures is configured to be in electrical communication with an access device of the vertical stacks of memory cells intersected by the vertical stack of conductive structures.

9. The microelectronic device of claim 1, further comprising global digit line contact structures individually in electrical communication with a drain region of one of the multiplexers and one of the global digit lines.

10. The microelectronic device of claim 1, wherein drain regions of pairs of the additional transistors horizontally neighboring one another are in electrical communication with each other.

11. The microelectronic device of claim 1, wherein a source region of each of the multiplexers is in electrical communication with one of the conductive pillar structures.

12. A microelectronic device, comprising:
vertical stacks of dynamic random access memory (DRAM) cells, each DRAM cell comprising a storage device horizontally neighboring an access device;
at least one multiplexer vertically overlying at least one of the vertical stacks of DRAM cells; and
at least one additional transistor structure vertically overlying the at least one of the vertical stacks of DRAM cells and horizontally neighboring the at least one multiplexer, the at least one multiplexer and the at least one additional transistor structure sharing a source region.

13. The microelectronic device of claim 12, further comprising global digit lines vertically overlying the at least one multiplexer.

14. The microelectronic device of claim 12, wherein the source region is in electrical communication with a conductive pillar structure vertically extending through the at least one of the vertical stacks of DRAM cells.

15. The microelectronic device of claim 12, wherein a drain region of the at least one multiplexer is in electrical communication with a global digit line.

16. The microelectronic device of claim 12, wherein a drain region of the at least one additional transistor structure is in electrical communication with a conductive plate structure.

17. The microelectronic device of claim 12, wherein a drain region of the at least one multiplexer is horizontally aligned with a drain region of the at least one additional transistor.

18. The microelectronic device of claim 17, wherein the drain region of the at least one multiplexer and the drain region of the at least one additional transistor are horizontally aligned with a global digit line in electrical communication with the at least one multiplexer.

19. The microelectronic device of claim 17, wherein the source region is horizontally offset from the drain region of the at least one multiplexer and the drain region of the at least one additional transistor.

20. The microelectronic device of claim 12, wherein a gate structure of the at least one multiplexer extends in a horizontal direction substantially perpendicular to word lines configured to be in electrical communication with the access devices of the DRAM cells.

21. A method of forming a microelectronic device, the method comprising:
forming a conductive material in an opening vertically extending through vertical stacks of access devices horizontally neighboring one another to form a conductive pillar structure in electrical communication with the access devices of each of the vertical stack of access devices;
forming an insulative liner material over the conductive material in the opening;
removing a lower portion of the insulative liner material and the conductive material at the lower portion of the opening to form isolated conductive pillar structures individually in electrical communication with one of the vertical stacks of access devices;
forming trenches through a stack structure of vertically alternating first materials and second materials on a side of each of the vertical stacks of access devices opposite the conductive pillar structure;
forming vertical stacks of capacitor structures in the trenches to form vertical stacks of memory cells, each vertical stack of memory cells comprising a vertical stack of capacitor structures in electrical communication with a vertical stack of access devices; and
forming a multiplexer and at least one additional transistor vertically over each of the vertical stack of memory cells.

22. The method of claim 21, wherein forming vertical stacks of capacitor structures in the trenches to form vertical stacks of memory cells comprises:
forming a first electrode material in the trenches;
forming a dielectric material over the first electrode material; and
forming a second electrode material over the dielectric material.

23. The method of claim 22, further comprising forming a conductive plate structure over the second electrode material in the trenches.

24. The method of claim 23, wherein forming at least one additional transistor comprises forming a drain region of the at least one additional transistor in electrical communication with the conductive plate structure.

25. The method of claim 21, wherein forming a multiplexer comprises forming a drain region of the multiplexer in electrical communication with a global digit line vertically overlying the multiplexer.

26. The method of claim 21, wherein forming a multiplexer and at least one additional transistor comprises forming a source region of the multiplexer shared with the at least one additional transistor.

27. An electronic system, comprising:
   an input device;
   an output device;
   a processor device operably coupled to the input device and the output device; and
   a memory device operably coupled to the processor device and comprising:
      a vertical stack of capacitor structures horizontally neighboring a vertical stack of access devices;
      a conductive plate structure in electrical communication with an electrode of each of the capacitor structures;
      a conductive pillar structure in electrical communication with the vertical stack of access devices;
      an additional vertical stack of capacitor structures comprising additional electrodes in electrical communication with the conductive pillar structure, the conductive plate structure horizontally intervening between the additional vertical stack of capacitor structures and the vertical stack of capacitor structures; and
      a multiplexer and a bleeder transistor vertically overlying the vertical stack of capacitor structures and the vertical stack of access devices.

28. The electronic system of claim 27, further comprising global digit lines vertically overlying the multiplexer and the bleeder transistor.

29. The electronic system of claim 28, wherein:
   a drain region of the multiplexer is in electrical communication with one of the global digit lines; and
   a source region of the multiplexer is in electrical communication with the conductive pillar structure.

30. The electronic system of claim 27, wherein the multiplexer comprises a source region shared with the bleeder transistor.

* * * * *